(12) United States Patent
Huang et al.

(10) Patent No.: US 11,227,836 B2
(45) Date of Patent: Jan. 18, 2022

(54) PAD STRUCTURE FOR ENHANCED BONDABILITY

(71) Applicant: Taiwan Semiconductor Manufacturing Co., Ltd., Hsin-Chu (TW)

(72) Inventors: Ru-Ying Huang, Taipei (TW); Yung-Ching Chen, Dali (TW); Yueh-Chiou Lin, Taichung County (TW); Yian-Liang Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 231 days.

(21) Appl. No.: 16/259,145

(22) Filed: Jan. 28, 2019

(65) Prior Publication Data
US 2020/0126920 A1    Apr. 23, 2020

Related U.S. Application Data

(60) Provisional application No. 62/749,219, filed on Oct. 23, 2018.

(51) Int. Cl.
*H01L 23/00*    (2006.01)
*H01L 23/48*    (2006.01)
(Continued)

(52) U.S. Cl.
CPC .... *H01L 23/5386* (2013.01); *H01L 21/76898* (2013.01); *H01L 21/8221* (2013.01);
(Continued)

(58) Field of Classification Search
CPC ......... H01L 31/02005; H01L 21/76898; H01L 21/8221; H01L 24/09; H01L 24/17;
(Continued)

(56) References Cited

U.S. PATENT DOCUMENTS

| 2009/0185060 A1* | 7/2009 | Akiyama | H01L 23/481 348/294 |
| 2010/0109006 A1* | 5/2010 | Kobayashi | H01L 27/14636 257/48 |

(Continued)

OTHER PUBLICATIONS

"How Do the Integrated Circuit Chip Electrodes Lead Out?" The date of publication is unknown. Retrieved online on Feb. 4, 2019 from http://www.wukong.com/questions/6412624360426701057/.
(Continued)

*Primary Examiner* — David Vu
*Assistant Examiner* — Brandon C Fox
(74) *Attorney, Agent, or Firm* — Eschweiler & Potashnik, LLC

(57) ABSTRACT

Various embodiments of the present application are directed towards a pad with high strength and bondability. In some embodiments, an integrated chip comprises a substrate, an interconnect structure, a pad, and a conductive structure. The interconnect structure adjoins the substrate and comprises wires and vias. The wires and the vias are stacked between the pad and the substrate. The conductive structure (e.g., a wire bond) extends through the substrate to the pad. By arranging the wires and the vias between the pad and the substrate, the pad may be inset into a passivation layer of the interconnect structure and the passivation layer may absorb stress on the pad. Further, the pad may contact the wires and the vias at a top wire level. A thickness of the top wire level may exceed a thickness of other wire levels, whereby the top wire level may be more tolerant to stress.

20 Claims, 16 Drawing Sheets

(51) Int. Cl.
*H01L 21/768* (2006.01)
*H01L 23/538* (2006.01)
*H01L 27/146* (2006.01)
*H01L 21/822* (2006.01)

(52) U.S. Cl.
CPC ........ *H01L 23/481* (2013.01); *H01L 23/5383* (2013.01); *H01L 24/09* (2013.01); *H01L 24/17* (2013.01); *H01L 24/49* (2013.01); *H01L 24/73* (2013.01); *H01L 27/1463* (2013.01); *H01L 27/1464* (2013.01); *H01L 27/14621* (2013.01); *H01L 27/14627* (2013.01); *H01L 27/14634* (2013.01); *H01L 27/14636* (2013.01); *H01L 2224/73207* (2013.01); *H01L 2924/3511* (2013.01); *H01L 2924/35121* (2013.01)

(58) Field of Classification Search
CPC ... H01L 24/49; H01L 24/73; H01L 27/14621; H01L 27/14627; H01L 27/1463; H01L 27/14634; H01L 27/14636; H01L 27/1464; H01L 23/5386; H01L 23/481; H01L 23/5383
USPC .......................................................... 257/432
See application file for complete search history.

(56) References Cited

U.S. PATENT DOCUMENTS

| | | | |
|---|---|---|---|
| 2011/0102657 | A1 | 5/2011 | Takahashi et al. |
| 2012/0292730 | A1* | 11/2012 | Tsai .................. H01L 27/14689 257/443 |
| 2013/0032916 | A1* | 2/2013 | Lin ................... H01L 27/14636 257/435 |
| 2015/0008555 | A1 | 1/2015 | Mizuta et al. |
| 2015/0249102 | A1* | 9/2015 | Terada ............. H01L 27/14687 257/444 |
| 2016/0233264 | A1 | 8/2016 | Kagawa et al. |
| 2017/0033144 | A1* | 2/2017 | Takahashi ......... H01L 27/14638 |
| 2017/0221942 | A1 | 8/2017 | Terada et al. |
| 2017/0221950 | A1 | 8/2017 | Ho et al. |
| 2020/0168653 | A1* | 5/2020 | Inoue .................... H04N 5/374 |

OTHER PUBLICATIONS

Haynie, Dave. "BSI Sensor is Better. But Why Expensive DSLR Cameras Uses CMOS Sensor Instead of BSI Sensor?" Published online on Mar. 4, 2017. Retrieved online on Feb. 18, 2019 from https://www.quora.com/BSI-sensor-is-better-But-why-expensive-DSLR-Cameras-uses-CMOS-sensor-instead-of-BSI-sensor.

Sony Semiconductor Solutions Corporation. "CMOS Image Sensor Image Sensor for Camera—Stacked CMOS Image Sensor." The date of publication is unknown. Retrieved online on Feb. 4, 2019 from http://www.sony-semicon.co.ip/products_en/IS/sensor2/technology/ist.html.

Koifman, Vladimir. "Sony Announces Stacked BSI Sensor." Image Sensors World. Published on Jan. 23, 2012. Retrieved online on Feb. 18, 2019 from http://image-sensors-world.blogspot.com/2012/01/sony-announces-stacked-bsi-sensor.html.

\* cited by examiner

PAD STRUCTURE FOR ENHANCED BONDABILITY

REFERENCE TO RELATED APPLICATION

This Application claims priority to U.S. Provisional Application No. 62/749,219, filed on Oct. 23, 2018, the contents of which are hereby incorporated by reference in their entirety.

BACKGROUND

Complementary metal-oxide semiconductor (CMOS) image sensors are used in a wide range of modern-day electronic devices, such as, for example, cameras, tablets, smart phones, and so on. CMOS image sensors may be front-side illuminated (FSI) or back-side illuminated (BSI). Compared to FSI CMOS image sensors, BSI CMOS image sensors have better sensitivity, better angular response, and greater metal routing flexibility.

BSI CMOS image sensors may be two dimensional (2D) or three dimensional (3D). A 2D BSI CMOS image sensor includes a pixel sensor array and associated circuitry in a single integrated chip, whereas a 3D BSI CMOS image sensor separates the pixel sensor array and the associated circuitry into separate integrated chips that are bonded together. Compared to 2D BSI CMOS image sensors, 3D BSI CMOS image sensors have increased speed, increased pixel density, lower cost, and smaller package sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
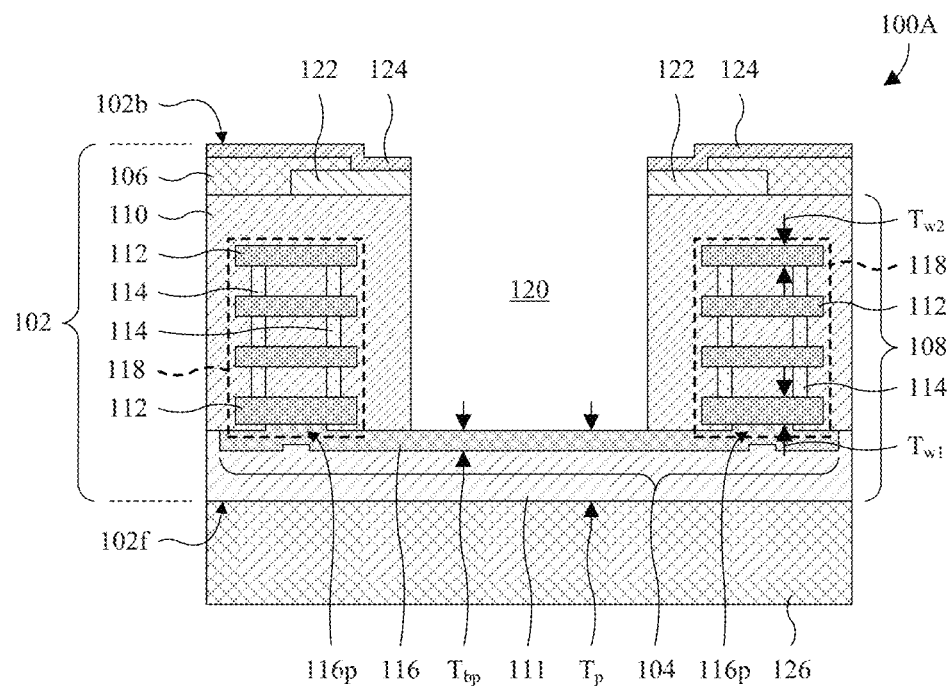
FIGS. 1A and 1B illustrate various views of some embodiments of integrated chips comprising a pad structure with enhanced strength and bondability.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a backside illuminated (BSI) image sensor comprises a substrate, an interconnect structure, and a pad structure. The substrate is on a backside of the BSI image sensor, and the interconnect structure is on a frontside of the BSI image sensor. The interconnect structure comprises a plurality of wires and a plurality of vias, and the pad structure comprises one or more conductive columns and a bond pad. The conductive column(s) is/are on the frontside of the BSI image sensor and is/are defined by the wires and the vias. The bond pad is on the backside of the BSI image sensor and has a pair of protrusions extending through the substrate to contact with the conductive column(s) at a wire level closest to the substrate (e.g., metal 1). In first embodiments of the pad structure, the protrusions protrude to a common conductive column. In second embodiments of the pad structure, the protrusions protrude to separate conductive columns adjoining and electrically coupled to a common wire.

During packaging of the BSI image sensor, the BSI image sensor is bonded and electrically coupled to an external structure through the pad structure. For example, a stack of conductive bumps or a bond wire may be formed on the bond pad to bond and electrically couple the BSI image sensor to the external structure. However, the bonding leads to a large amount of stress on the bond pad and may, for example, lead to peeling and/or cracking defects at the bond pad. Further, because the bond pad protrudes to contact with the conductive column(s), the stress on the bond pad is transferred to the conductive column(s). This may, for example, lead to a crack defect propagating from the bond pad to the conductive column(s) and/or may, for example, lead to delamination of the bond pad.

Various embodiments of the present application are directed towards a pad structure with high strength and bondability. In some embodiments, an integrated chip comprises a substrate, an interconnect structure, and a bond pad. The interconnect structure adjoins the substrate and comprises multiple wires and multiple vias. The wires and the vias are alternatingly stacked between the bond pad and the substrate. Further, the interconnect structure partially defines a pad opening extending through the substrate and exposing the bond pad. By arranging the wires and the vias between the bond pad and the substrate, the bond pad may be inset into a passivation layer of the interconnect structure and the passivation layer may absorb stress on the bond pad. This, in turn, enhances the strength and bondability of the pad structure and reduces the likelihood of peeling and/or cracking defects at the bond pad. Further, the bond pad may contact the wires and the vias at a top wire level (i.e., a wire level of the interconnect structure farthest from the substrate) of the interconnect structure. A thickness of the top wire level may exceed a thickness of other wire levels, whereby the top wire level may be more tolerant to stress. This, in turn, further enhances the strength and bondability of the pad structure and reduces the likelihood of peeling and/or cracking defects at the bond pad With reference to FIG. 1A, a cross-sectional view 100A of some embodiments of an integrated chip 102 comprising a pad structure 104 with enhanced strength and enhanced bondability is provided. The integrated chip 102 further comprises a chip substrate 106 and an interconnect structure 108. The chip substrate 106 is on a backside 102b of the integrated chip 102, and the interconnect structure 108 is on a frontside 102f of the integrated chip 102. The interconnect structure 108 comprises an interconnect dielectric structure 110, a passivation layer 111, a plurality of wires 112, and a plurality of vias 114. For ease of illustration, only some of the wires 112 are labeled 112 and only some of the vias 114 are labeled 114. The interconnect dielectric structure 110 is between the passivation layer 111 and the chip substrate 106, and the wires 112 and the vias 114 are alternatingly stacked in the interconnect dielectric structure 110.

The pad structure 104 is below the chip substrate 106, in the interconnect structure 108. Further, the pad structure 104 comprises a bond pad 116 and a pair of conductive columns 118. The bond pad 116 is inset into the passivation layer 111, between the passivation layer 111 and the interconnect dielectric structure 110. Further, the bond pad 116 underlies and adjoins the conductive columns 118 to electrically couple the conductive columns 118 together. In some embodiments, the bond pad 116 has protrusions 116p respectively protruding to the conductive columns 118. Further, the bond pad 116 is exposed by a pad opening 120. The pad opening 120 extends through the chip substrate 106 and the interconnect structure 108 to the bond pad 116 and is at least partially defined by the interconnect structure 108. The conductive columns 118 are defined by the wires 112 and the vias 114 and are arranged so the pad opening 120 is between the conductive columns 118. In some embodiments, the conductive columns 118 are segments of a single conductive structure extending continuously in a closed path around the bond pad 116 when viewed top down. The single conductive structure may, for example, have a square ring shape, some other suitable ring shape, or some other suitable closed-path shape when viewed top down.

By insetting the bond pad 116 into the passivation layer 111, the passivation layer 111 may absorb stress imposed on the bond pad 116. This, in turn, enhances the strength and bondability of the pad structure 104 and reduces the likelihood of peeling and/or cracking defects at the bond pad 116. Further, by insetting the bond pad 116 into the passivation layer 111, the bond pad 116 contacts the conductive columns 118 at a top wire level of the interconnect structure 108 (i.e., a wire level of the interconnect structure 108 farthest from the chip substrate 106). A thickness $T_{w1}$ of the top wire level exceeds a thickness $T_{w2}$ of other wire levels, whereby the top wire level is more tolerant to stress and is less likely to crack under stress. This, in turn, further enhances the strength and bondability of the pad structure 104 and reduces the likelihood of peeling and/or cracking defects at the bond pad 116

In some embodiments, a thickness $T_{bp}$ of the bond pad 116 is about 0.6-36.0 kiloangstroms, about 0.6-18.0 kiloangstroms, or about 18.0-36.0 kiloangstroms. Other thicknesses are, however, amenable. If the thickness $T_{bp}$ of the bond pad 116 is too small (e.g., less than about 0.6 kiloangstroms or some other suitable value), the bond pad 116 will be weak and prone to failure. If the thickness $T_{bp}$ of the bond pad 116 is too large (e.g., greater than about 36.0 kiloangstroms or some other suitable value), material will be wasted. In some embodiments, a thickness $T_p$ of the passivation layer 111 is about 10-15 kiloangstroms, about 10.00-12.75 kiloangstroms, or about 12.75-15.00 kiloangstroms. Other thicknesses are, however, amenable. If the thickness $T_p$ of the passivation layer 111 is too small (e.g., less than about 10 kiloangstroms or some other suitable value), the passivation layer 111 will lack sufficient rigidity and/or strength to meaningfully strengthen the bond pad 116. If the thickness $T_p$ of the passivation layer 111 is too large (e.g., greater than about 15.0 kiloangstroms or some other suitable value), material will be wasted.

In some embodiments, an isolation structure 122 extends into the chip substrate 106, between the chip substrate 106 and the interconnect structure 108, and partially defines the pad opening 120. The isolation structure 122 comprises a dielectric material and may be, for example, a shallow trench isolation (STI) structure or some other suitable isolation structure. In some embodiments, a buffer layer 124 lines the chip substrate 106, on the backside 102b of the integrated chip 102, and partially defines the pad opening 120. The buffer layer 124 may, for example, be or comprise silicon oxide, silicon nitride, silicon oxynitride, some other suitable dielectric(s), or any combination of the foregoing.

In some embodiments, the chip substrate 106 is a bulk silicon substrate, a silicon-on-insulator (SOI) substrate, or some other suitable semiconductor substrate. In some embodiments, the interconnect dielectric structure 110 is or comprise silicon oxide, a low κ dielectric, some other suitable dielectric(s), or any combination of the foregoing. As used herein, a low κ dielectric may be, for example, a dielectric with a dielectric constant κ less than about 3.9, 3, 2, or 1. In some embodiments, the passivation layer 111 is or comprises silicon oxide, silicon nitride, silicon oxynitride, some other suitable dielectric(s), or any combination of the foregoing. In some embodiments, the wires 112, the vias 114, and the bond pad 116 are copper, tungsten, aluminum copper, some other suitable metal(s) and/or conductive material(s), or any combination of the foregoing. For example, the wires 112 and the vias 114 may be or comprise copper and/or the bond pad 116 may be or comprise aluminum copper.

In some embodiments, the frontside 102f of the integrated chip 102 is bonded to a support substrate 126. The support substrate 126 may, for example, provide mechanical support to the integrated chip 102 to prevent warping and/or cracking. This, in turn, may enhance the strength of the pad structure 104 to prevent cracking and/or delamination. The support substrate 126 may, for example, be a bulk silicon substrate or some other suitable substrate. In other embodiments, the support substrate 126 is omitted.

Figure 1B:
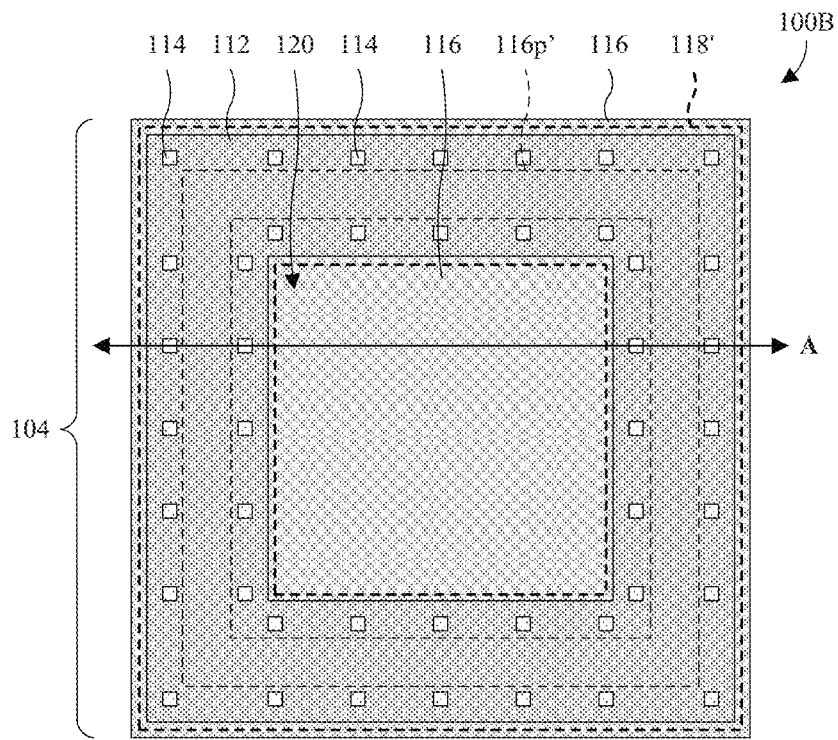

With reference to FIG. 1B, a top layout 100B of some embodiments of the pad structure 104 of FIG. 1A is provided. The cross-sectional view 100A of FIG. 1A may, for example, be taken along line A. The bond pad 116 has a square shaped layout, but other shapes and/or layouts are amenable. The protrusions 116p of FIG. 1A are segments of a single protrusion 116p' (shown in phantom). The single protrusion 116p' extends along a boundary of the bond pad 116 in a closed path to enclose the pad opening 120. The single protrusion 116p' may, for example, have a square ring-shaped layout, some other suitable ring-shaped layout, or some other suitable closed-path layout.

The conductive columns 118 of FIG. 1A are segments of a single conductive structure 118'. The single conductive structure 118' extends along the boundary of the bond pad 116 in a closed path to enclose the pad opening 120. The single conductive structure 118' may, for example, have a square ring-shaped layout, some other suitable ring-shaped layout, or some other suitable closed-path layout. Further, the single conductive structure 118' is defined by the wires 112 of FIG. 1A and the vias of FIG. 1A. The wires 112 are grouped into a plurality of wire levels (e.g., the four wire levels illustrated in FIG. 1A), and the single conductive structure 118' is defined in part by a wire from each of the wire levels. The wire from each of the wire levels extends laterally in a closed path to enclose the pad opening 120. Further, the wire from each of the wire levels may, for example, have the same layout as the single conductive structure 118' and/or may, for example, have a square ring-shaped layout, some other suitable ring-shaped layout, or some other suitable closed-path layout.

Figure 2:
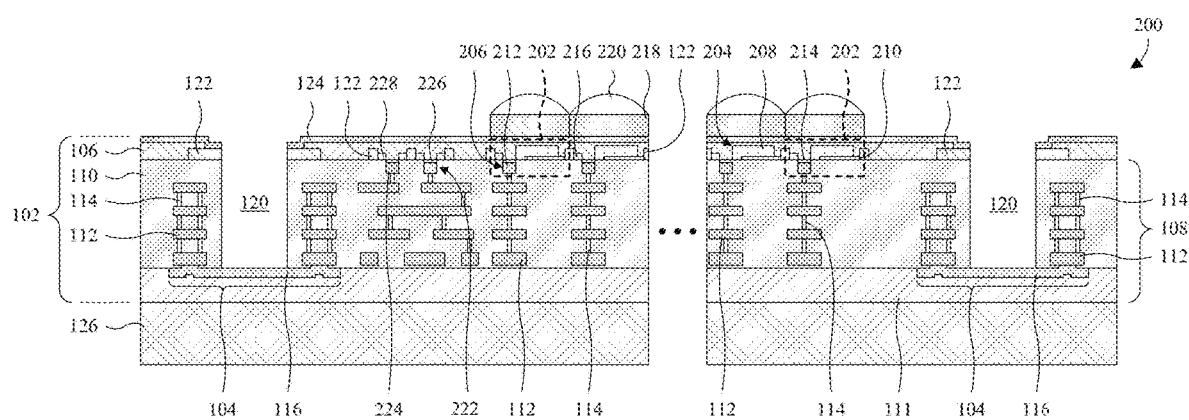
FIG. 2 illustrates an expanded cross-sectional view of some embodiments of the integrated chip of FIG. 1A in which the integrated chip comprises an image sensor.

With reference to FIG. 2, an expanded cross-sectional view 200 of some embodiments of the integrated chip 102 of FIG. 1A is provided in which the integrated chip 102 is or comprises a BSI complementary metal-oxide-semiconductor (CMOS) image sensor or some other suitable BSI image sensor. Multiple instances of the pad structure 104 are respectively on opposite sides of the integrated chip 102 and an array of pixel sensors 202 is between the multiple instances. For ease of illustration, only some of the pixel sensors 202 are labeled 202. The pixel sensors 202 comprise individual photodetectors 204 and individual transfer transistors 206. For ease of illustration, only one of the photodetectors 204 is labeled 204 and only one of the transfer transistors 206 is labeled 206. In alternative embodiments, the transfer transistors 206 are omitted.

The photodetectors 204 are in the chip substrate 106 and, in some embodiments, comprise individual collector regions 208 and individual cap regions 210. For ease of illustration, only one of the collector regions 208 is labeled 208 and only one of the cap regions 210 is labeled 210. The collector regions 208 and the cap regions 210 are in the chip substrate 106 and have opposite doping types. Further, the cap regions 210 have the same doping type as a bulk of the chip substrate 106 or well (not shown) within which the photodetectors 204 are located. During operation, the photodetectors 204 absorb radiation to generate electron-hole pairs. PN junctions of the photodetectors 204 define electric fields that separate the electrons of the electron-hole pairs from the holes of the electron-hole pairs. Electrons accumulate in the collector regions 208, whereas holes move outside of the collector regions 208.

The transfer transistors 206 are on the chip substrate 106, between the chip substrate 106 and the interconnect structure 108. The transfer transistors 206 comprise individual transfer gate electrodes 212, individual transfer gate dielectric layers 214, and individual source/drain regions. For ease of illustration, only one of the transfer gate electrodes 212 is labeled 212 and only one of the transfer gate dielectric layers 214 is labeled 214. The transfer gate electrodes 212 are respectively stacked with the transfer gate dielectric layers 214. First sides of the transfer gate electrodes 212 border the collector regions 208, which define first source/drain regions of the transfer transistors 206. Second sides of the transfer gate electrodes 212 border floating diffusion nodes (FDNs) 216, which define second source/drain regions of the transfer transistors 206. For ease of illustration, only one of the FDNs 216 is labeled 216.

In some embodiments, the isolation structure 122 separates the pixel sensors 202 from each other. In some embodiments, color filters 218 and/or micro lenses 220 are stacked over the pixel sensors 202. The color filters 218 pass assigned wavelengths of radiation while blocking other wavelengths of radiation, and the micro lenses 220 focus radiation on the photodetectors 204.

A plurality of logic devices 222 are between the array of pixel sensors 202 and at least one instance of the pad structure 104. For ease of illustration, only one of the logic devices 222 is labeled 222. The logic devices 222 may, for example, implement image signal processing (ISP) circuitry, read/write circuitry, some other suitable circuitry, or any combination of the foregoing. In some embodiments, the logic devices 222 comprise individual logic gate electrodes 224, individual logic gate dielectric layers 226, and individual source/drain regions 228. For ease of illustration, only one of the logic gate electrodes 224 is labeled 224, only one of the logic gate dielectric layers 226 is labeled 226, and only one of the source/drain regions 228 is labeled 228. The logic gate electrodes 224 and the logic gate dielectric layers 226 are stacked on the chip substrate 106, between the chip substrate 106 and the interconnect structure 108, and the source/drain regions 228 border the logic gate electrodes 224 in the chip substrate 106. In some embodiments, the isolation structure 122 separates the logic devices 222 from each other.

Figure 3:
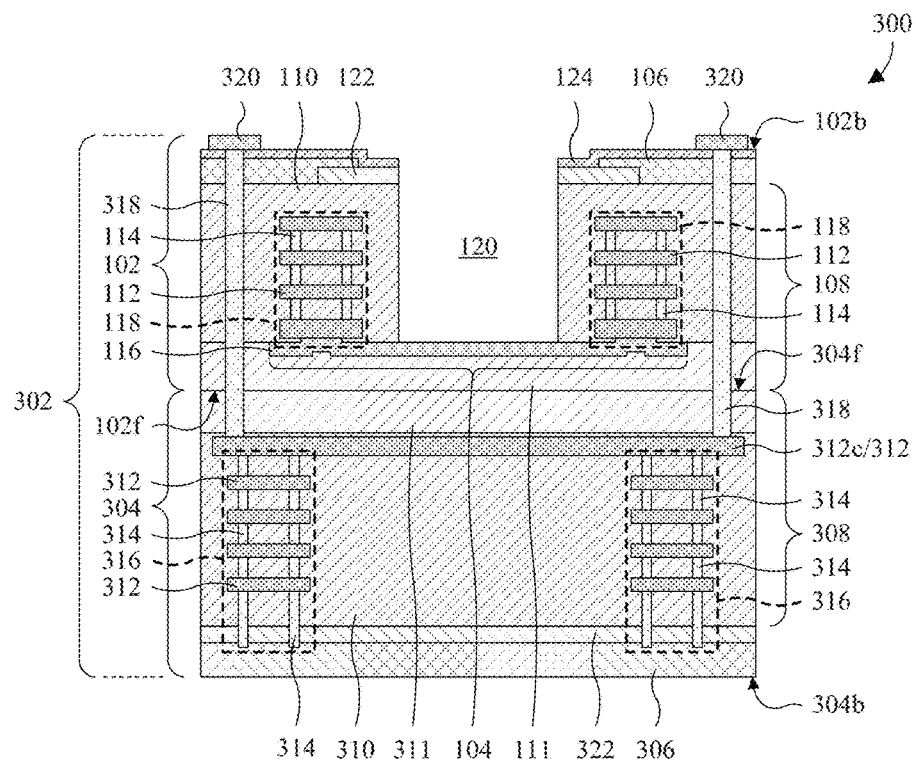
FIG. 3 illustrates a cross-sectional view of some embodiments of a three-dimensional integrated chip (3DIC) comprising the integrated chip of FIG. 1A.

With reference to FIG. 3, a cross-sectional view 300 of some embodiments of a three-dimensional integrated chip (3DIC) 302 comprising the integrated chip 102 (also known as the first integrated chip 102) of FIG. 1A is provided. The 3DIC 302 further comprises a second integrated chip 304. The first and second integrated chips 102, 304 are stacked and bonded together at frontsides 102f, 304f of the first and second integrated chips 102, 304. The first integrated chip 102 comprises the chip substrate 106 (also known as the first chip substrate 106) and the interconnect structure 108 (also known as the first interconnect structure 108). Similar to the first integrated chip 102, the second integrated chip 304 comprises a second chip substrate 306 and a second interconnect structure 308.

The second chip substrate 306 is on a backside 304b of the second integrated chip 304, and the second interconnect structure 308 is on a frontside 304f of the second integrated chip 304. The second interconnect structure 308 comprises a second interconnect dielectric structure 310, a second passivation layer 311, a plurality of second wires 312, and a plurality of second vias 314. For ease of illustration, only some of the second wires 312 are labeled 312 and only some of the second vias 314 are labeled 314. The second interconnect dielectric structure 310 is between the second passivation layer 311 and the second chip substrate 306, and the second wires 312 and the second vias 314 are alternatingly stacked in the second interconnect dielectric structure 310. The second wires 312 and the second vias 314 define a pair of second conductive columns 316. The second conductive columns 316 extend from a common wire 312c to the second chip substrate 306 and are respectively on opposite sides of the pad opening 120.

A pair of through substrate vias (TSVs) 318 extends through the first integrated chip 102 to the common wire 312c. The TSVs 318 are respectively on opposite sides of the pad opening 120, and the conductive columns 118 of the first integrated chip 102 (also known as the first conductive columns 118) are between the TSVs 318. Further, the TSVs 318 are electrically coupled together by the common wire 312c, and electrically couple the common wire 312c to a pair of TSV pads 320 on the backside 102b of the first integrated chip 102. The TSVs 318 and the TSV pads 320 may, for example, be or comprise copper, aluminum copper, tungsten, some other suitable metal(s) and/or conductive material(s), or any combination of the foregoing. In alternative embodiments, the TSVs 318 and the TSV pads 320 are omitted.

In some embodiments, a second isolation structure 322 extends into the second chip substrate 306, between the second chip substrate 306 and the second interconnect structure 308. The second isolation structure 322 comprises a dielectric material and may be, for example, a STI structure or some other suitable isolation structure.

In some embodiments, the second chip substrate 306 is a bulk silicon substrate, a SOI substrate, or some other suitable semiconductor substrate. In some embodiments, the second interconnect dielectric structure 310 is or comprise silicon oxide, a low κ dielectric, some other suitable dielectric(s), or any combination of the foregoing. In some embodiments, the second passivation layer 311 is or comprises silicon oxide, silicon nitride, silicon oxynitride, some other suitable dielectric(s), or any combination of the foregoing. In some embodiments, the second wires 312 and the wires vias 314 are copper, tungsten, aluminum copper, some other suitable metal(s) and/or conductive material(s), or any combination of the foregoing.

Figure 4:
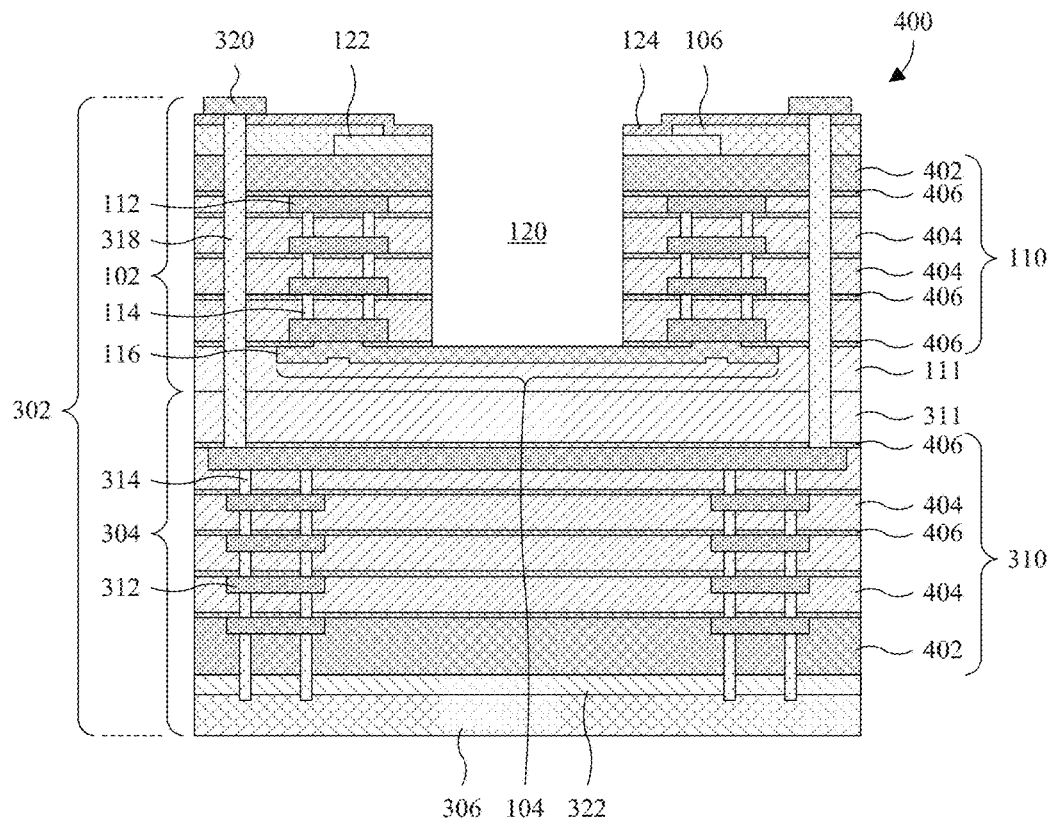
FIG. 4 illustrates a cross-sectional view of some more detailed embodiments of an interconnect dielectric structure in the 3DIC of FIG. 3.

With reference to FIG. 4, a cross-sectional view 400 of some more detailed embodiments of the 3DIC 302 of FIG. 3 is provided in which the first and second interconnect dielectric structures 110, 310 comprise multiple layers. The first and second interconnect dielectric structures 110, 310 comprise individual interlayer dielectric (ILD) layers 402 and individual inter-metal dielectric (IMD) layers 404. For ease of illustration, only some of the IMD layers 404 are labeled 404. The ILD layers 402 respectively border the first and second chip substrates 106, 306, and the IMD layers 404 are between the first and second passivation layers 111, 311 and respectively the ILD layers 402. The ILD and IMD layers 402, 404 may, for example, be or comprise a low κ dielectric and/or some other suitable dielectric(s).

In some embodiments, the first and second interconnect dielectric structures 110, 310 further comprise individual etch stop layers 406 separating the IMD layers 404 from each other, from the ILD layers 402, and from the first and second passivation layers 111, 311. For ease of illustration, only some of the etch stop layers 406 are labeled 406. The etch stop layers 406 may, for example, be or comprise silicon carbide, silicon nitride, silicon oxynitride, some other suitable dielectric material(s), or any combination of the foregoing.

While FIG. 4 illustrates and describes multilayer embodiments of the first and second interconnect dielectric structures 110, 310 using the 3DIC 302 of FIG. 3, it is to be appreciated that the multilayer embodiments may be used in the integrated chip 102 in any one of FIGS. 1A and 2.

Figure 5:
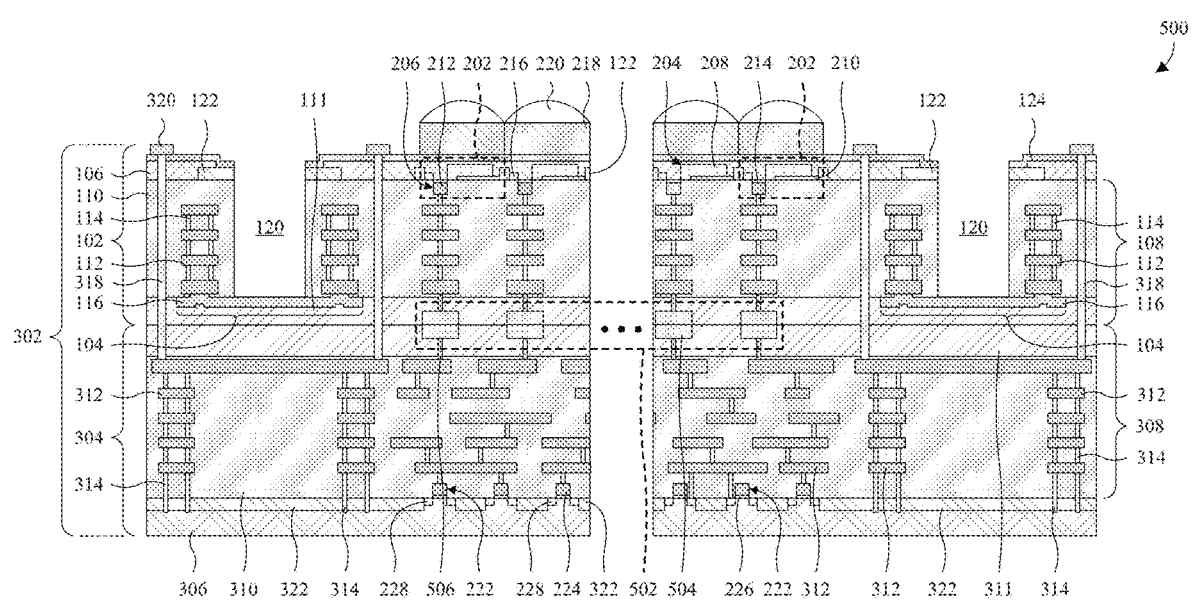
FIG. 5 illustrates an expanded cross-sectional view of some embodiments of the 3DIC of FIG. 3 in which the 3DIC comprises an image sensor.

With reference to FIG. 5, an expanded cross-sectional view 500 of some embodiments of the 3DIC 302 of FIG. 3 is provided in which the 3DIC 302 is or comprises a 3D BSI CMOS image sensor or some other suitable 3D BSI image sensor. Multiple instances of the pad structure 104 are respectively on opposite sides of the 3DIC 302 and an array of pixel sensors 202 is between the multiple instances. For ease of illustration, only some of the pixel sensors 202 are labeled 202. In some embodiments, the isolation structure 122 of the first integrated chip 102 separates the pixel sensors 202 from each other. Further, in some embodiments, color filters 218 and/or micro lenses 220 are stacked over the pixel sensors 202. The pixel sensors 202, the color filters 218, the micro lenses 220, or any combination of the foregoing may, for example, be as described with regard to FIG. 2.

A plurality of logic devices 222 is on the second chip substrate 306, between the second chip substrate 306 and the second interconnect structure 308. For ease of illustration, only some of the logic devices 222 are labeled 222. The logic devices 222 may, for example, implement ISP circuitry, read/write circuitry, some other suitable circuitry, or any combination of the foregoing. Further, the logic devices 222 may, for example, be as described with regard to FIG. 2.

In some embodiments, a hybrid bond structure 502 is between the first and second integrated chips 102, 304 to provide bonding and electrically coupling between the first and second integrated chips 102, 304. The hybrid bond structure 502 comprises hybrid bond pads 504 and hybrid bond vias 506 in the first and second passivation layers 111, 311. For ease of illustration, only one of the hybrid bond pads 504 is labeled 504 and only one of the hybrid bond vias 506 is labeled 506. The hybrid bond pads 504 and the hybrid bond vias 506 may be or comprise, for example, copper, aluminum, aluminum copper, some other suitable metal(s) and/or conductive material(s), or any combination of the foregoing. In alternative embodiments, the hybrid bond structure 502 is omitted. In alternative embodiments, the TSVs 318 are omitted.

Figure 6A:
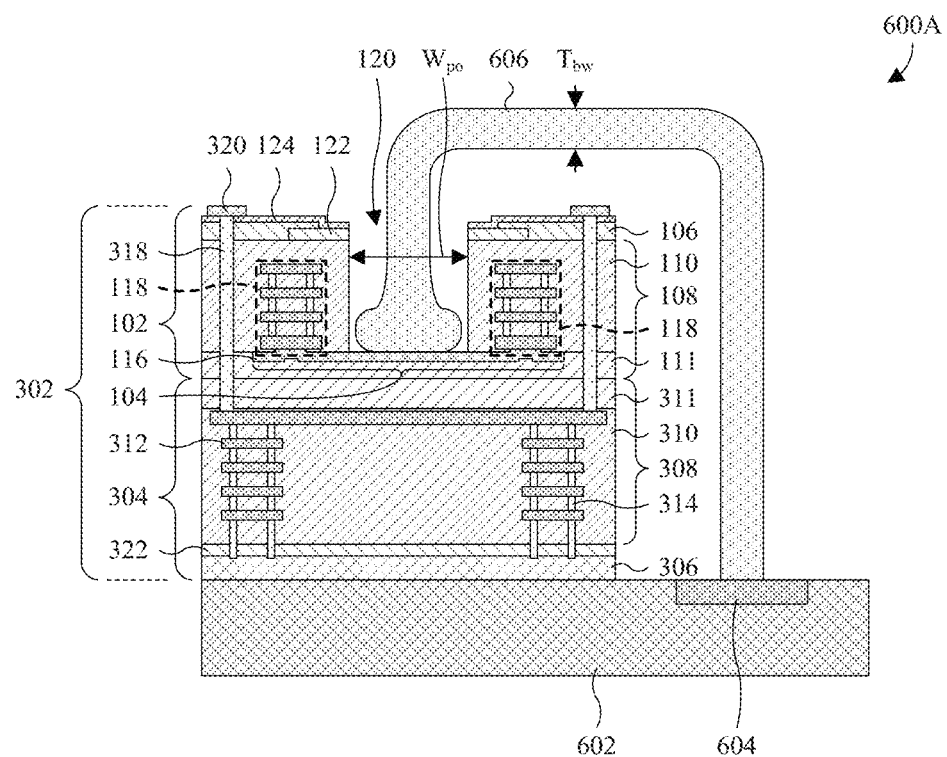
FIGS. 6A and 6B illustrate cross-sectional views of some embodiments of integrated chip packages in which the 3DIC of FIG. 3 is electrically coupled to a package substrate by wire bonding and flip chip bonding.

With reference to FIG. 6A, a cross-sectional view 600A of some embodiments of an integrated chip package is provided in which the 3DIC 302 of FIG. 3 is electrically coupled to a package substrate 602 by wire bonding. In some embodiments, the package substrate 602 is ceramic or some other suitable insulating material. The package substrate 602 comprises a package pad 604, and a bond wire 606 extends from the package pad 604 to the bond pad 116 of the 3DIC 302. The bond wire 606 may, for example, be or comprise copper, aluminum, aluminum copper, some suitable metal(s) and/or conductive material(s), or any combination of the foregoing.

Formation of the bond wire 606 may impose high stress on the bond pad 116. Because the bond pad 116 is inset into the first passivation layer 111, the first passivation layer 111 absorbs stress imposed on the bond pad 116. This, in turn, reduces the likelihood of peeling and/or cracking defects at the bond pad 116. Further, because the bond pad 116 contacts the conductive columns 118 at the top wire level of the first interconnect structure 108, cracking at this interface is less likely. The top wire level is thicker than other wire levels and is hence more tolerant of stress and less likely to crack.

In some embodiments, a thickness $T_{bw}$ of the bond wire 606 is about 1 mil, about 2 mils, or some other suitable thickness. If the thickness $T_{bw}$ of the bond wire 606 is too thin (e.g., less than about 1 mil or some other suitable value), the bond wire 606 may be weak and prone to cracking and/or breaking. If the thickness $T_{bw}$ of the bond wire 606 is too great (e.g., greater than about 2 mil or some other suitable value), the bond wire 606 will be too rigid and impose a large amount of stress on the bond pad 116 during formation. In some embodiments, a width $W_{po}$ of the pad opening 120 is greater than about 60 micrometers and/or a top layout of the pad opening 120 is square shaped. Such embodiments may, for example, arise when the thickness $T_{bw}$ of the bond wire 606 is about 1 mil or some other suitable value. In other embodiments, the width $W_{po}$ of the pad opening 120 has some other suitable value and/or the top layout of the pad opening 120 has some other suitable shape.

Figure 6B:
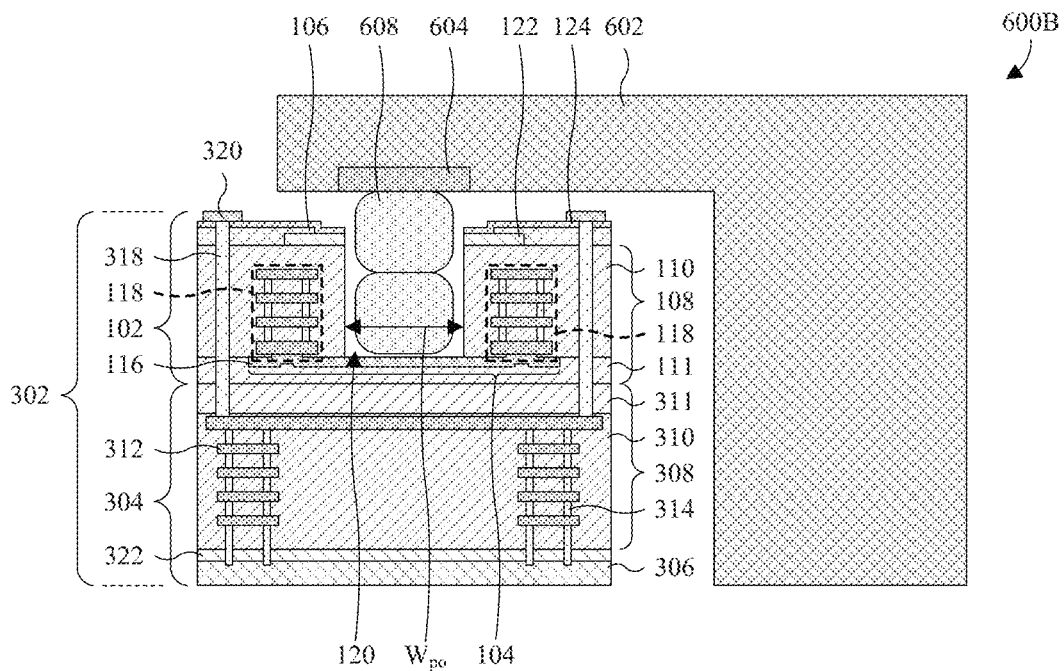

With reference to FIG. 6B, a cross-sectional view 600B of some alternative embodiments of the integrated chip package of FIG. 6A is provided in which the 3DIC 302 of FIG. 3 is electrically coupled to the package substrate 602 by flip chip bonding. The package substrate 602 overhangs the pad opening 120 and conductive bumps 608 are stacked from the bond pad 116 to the package pad 604. For ease of illustration, only one of the conductive bumps 608 is labeled 608. The conductive bumps 608 may, for example, be or comprise gold, silver, copper, aluminum, aluminum copper, some other suitable metal(s) and/or conductive materials, or any combination of the foregoing.

Figure 7A:
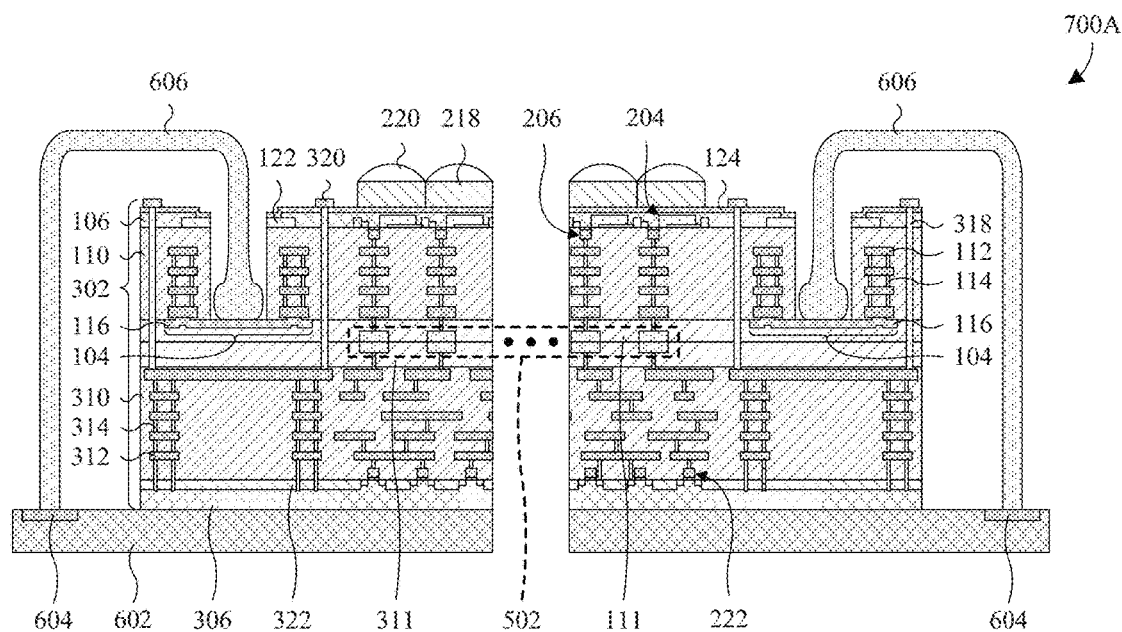
FIGS. 7A and 7B illustrate expanded cross-sectional views of some embodiments of the integrated chip packages of FIGS. 6A and 6B in which the integrated chip packages comprise the 3DIC of FIG. 5.
Figure 7B:
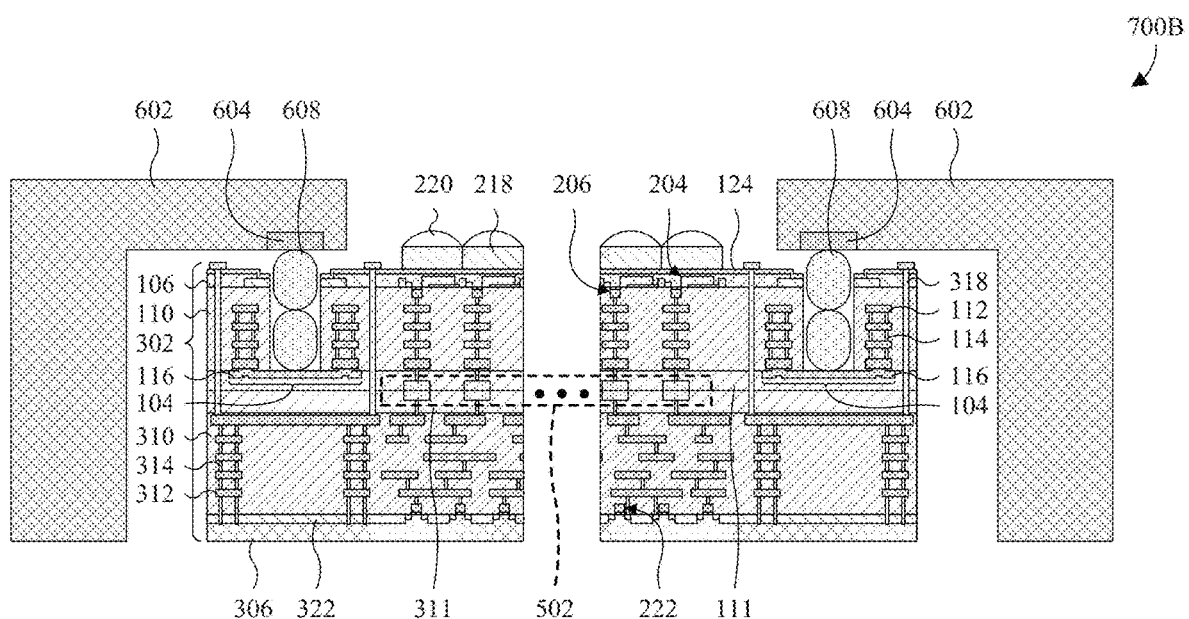

With reference to FIGS. 7A and 7B, expanded cross-sectional views 700A, 700B of some embodiments of the integrated chip packages respectively of FIGS. 6A and 6B are provided in which the integrated chip packages comprise the 3DIC 302 of FIG. 5.

While FIGS. 6A and 6B use embodiments of the 3DIC 302 in FIG. 3, embodiments in FIG. 4 may instead be used. Similarly, while FIGS. 6A and 6B use the 3DIC 302 in FIG. 3, the integrated chip 102 in FIG. 1A (with or without the support substrate 126) may instead be used. While FIGS. 7A and 7B use the 3DIC 302 in FIG. 5, the integrated chip 102 in FIG. 2 (with or without the support substrate 126) may instead be used.

With reference to FIGS. 8-23, 24A, and 24B, a series of cross-sectional views 800-2300, 2400A, 2400B of some embodiments of a method for forming an integrated chip package comprising a pad structure with enhanced strength and bondability is provided. First embodiments of the method proceed from FIGS. 8-23 to FIG. 24A (and skip FIG. 24B) to form the integrated chip package of FIG. 7A, whereas second embodiments of the method proceed from FIGS. 8-23 to FIG. 24B (and skip FIG. 24A) to form the integrated chip package of FIG. 7B.

Figure 8:
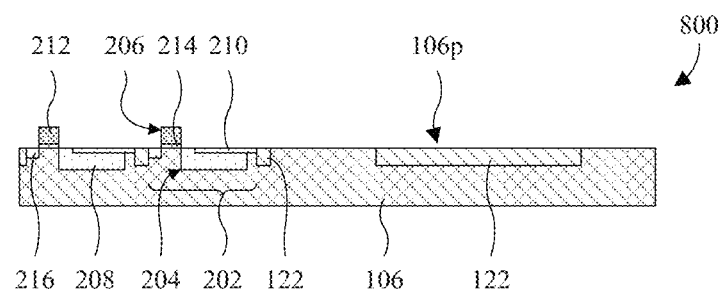
FIGS. 8-23, 24A, and 24B illustrate a series of cross-sectional views of some embodiments of a method for forming an integrated chip package comprising a pad structure with enhanced strength and bondability.

As illustrated by the cross-sectional view 800 of FIG. 8, a first isolation structure 122 and a plurality of pixel sensors 202 are formed on a first chip substrate 106. For ease of illustration, only some segments of the first isolation structure 122 are labeled 122 and only one of the pixel sensors 202 is labeled 202. The first isolation structure 122 separates the pixel sensors 202 from each other and adjoins a pad region 106*p* of the first chip substrate 106. The pixel sensors 202 comprise individual photodetectors 204 and individual transfer transistors 206. For ease of illustration, only one of the photodetectors 204 is labeled 204 and only one of the transfer transistors 206 is labeled 206. The photodetectors 204 and/or the transfer transistors 206 may, for example, be as described with regard to FIG. 2.

In some embodiments, a process for forming the first isolation structure 122 comprises: 1) patterning the first chip substrate 106 to form isolation trenches with a layout of the first isolation structure 122; and 2) filling the isolation trenches with a dielectric material. In some embodiments, a process for forming the pixel sensors 202 comprises: 1) depositing a dielectric layer and a conductive layer stacked over the first isolation structure 122 and the first chip substrate 106; 2) patterning the dielectric layer and the conductive layer into transfer gate electrodes 212 and transfer gate dielectric layers 214; and 3) performing a series of doping processes to form photodetectors 204 and FDNs 216 bordering the transfer gate electrodes 212. For ease of illustration, only one of the transfer gate electrodes 212 is labeled 212, only one of the transfer gate dielectric layers 214 is labeled 214, and only one of the FDNs 216 is labeled 216.

Figure 9:
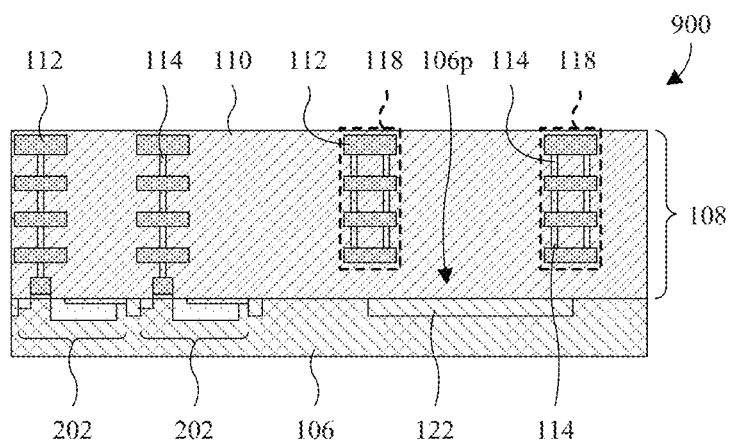

As illustrated by the cross-sectional view 900 of FIG. 9, a first interconnect structure 108 is partially formed on the first chip substrate 106. The first interconnect structure 108 comprises a first interconnect dielectric structure 110, a plurality of first wires 112, and a plurality of first vias 114. For ease of illustration, only some of the first wires 112 are labeled 112 and only some of the first vias 114 are labeled 114. The first wires 112 and the first vias 114 are alternatingly stacked in the interconnect dielectric structure 110 and define conductive paths leading from the pixel sensors 202. Further, the first wires 112 and the first vias 114 define a pair of conductive columns 118 overlying the pad region 106*p* of the first chip substrate 106.

In some embodiments, a process for partially forming the first interconnect structure 108 comprises: 1) forming a bottommost level of the vias 114 by a single damascene process; 2) forming a bottommost level of the wires 112 by the single damascene process; 3) forming wires and vias over the bottommost level of the wires 112 by repeatedly performing a dual damascene process; and 4) forming a top portion of the first interconnect dielectric structure 110 covering a topmost level of the wires 112. Other processes for forming the first interconnect structure 108 are, however, amenable. In some embodiments, the single damascene process comprises: 1) depositing a dielectric layer; 2) patterning the dielectric layer with openings for a single level of conductive features (e.g., a level of vias or a level of wires); 3) and filling the openings with conductive material to form the single level of conductive features. In some embodiments, the dual damascene process comprises: 1) depositing a dielectric layer; 2) patterning the dielectric layer with openings for two levels of conductive features (e.g., a level of vias and a level of wires); 3) and filling the openings with conductive material to form the two levels of conductive features. In both the single and dual damascene processes, the dielectric layer corresponds to a portion of the first interconnect dielectric structure 110. In some embodiments, the top portion of the first interconnect dielectric structure 110, which covers the topmost level of the wires 112, is formed by vapor deposition and/or some other suitable deposition process(es).

Figure 10:
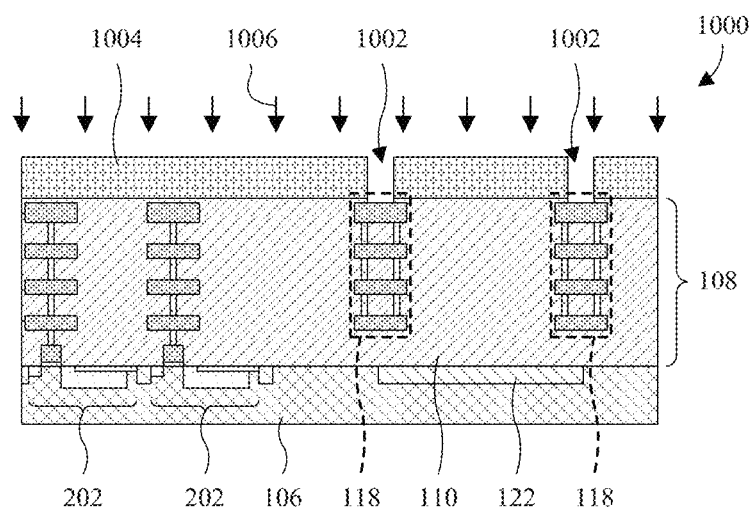

As illustrated by the cross-sectional view 1000 of FIG. 10, the first interconnect dielectric structure 110 is patterned to form pad-protrusion openings 1002 respectively overlying and exposing the conductive columns 118. The patterning may, for example, be performed by a photolithography/etching process or some other suitable patterning process. In some embodiments, the photolithography/etching process comprises: 1) forming a photoresist mask 1004 with a layout of the pad-protrusion openings 1002 on the first interconnect dielectric structure 110; 2) applying an etchant 1006 to the first interconnect dielectric structure 110 with the photoresist mask 1004 in place; and 3) stripping the photoresist mask 1004.

Figure 11:
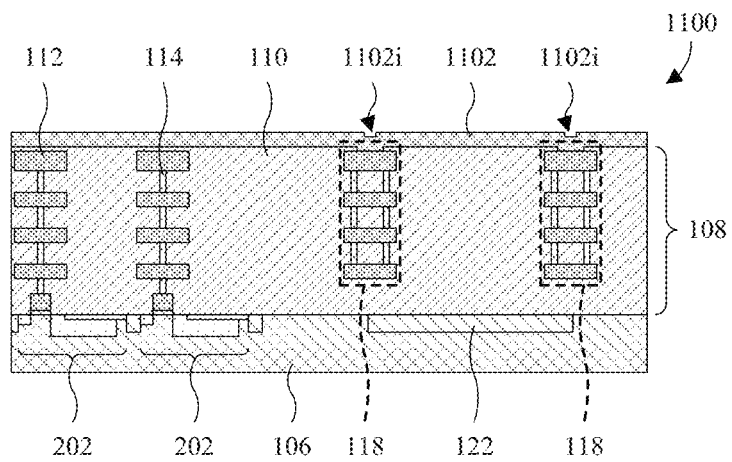

As illustrated by the cross-sectional view 1100 of FIG. 11, a bond pad layer 1102 is deposited on the first interconnect dielectric structure 110, filling the pad-protrusion openings 1002 (see FIG. 10). The bond pad layer 1102 may, for example, be or comprise copper, aluminum, aluminum copper, some other suitable conductive material(s), or any combination of the foregoing. In some embodiments, the deposition is performed by chemical vapor deposition (CVD), physical vapor deposition (PVD), electroplating, electroless plating, some other suitable deposition process(es), or any combination of the foregoing. In some embodiments, the deposition is conformal and/or is such that the bond pad layer 1102 has indents 1102i at the pad-protrusion openings 1002.

Figure 12:
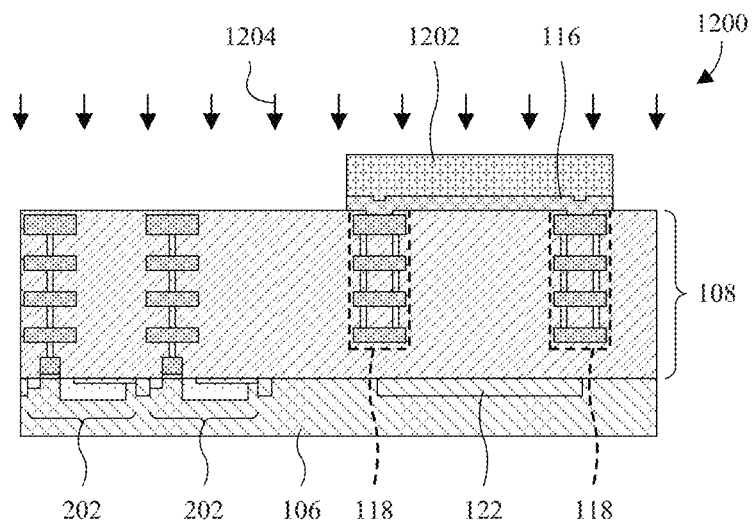

As illustrated by the cross-sectional view 1200 of FIG. 12, the bond pad layer 1102 (see FIG. 11) is patterned to form a bond pad 116 overlying the pad region 106p of the first chip substrate 106. Further, the bond pad 116 is formed protruding to contact with the conductive columns 118 at the pad-protrusion openings 1002 (see FIG. 10). The patterning may, for example, be performed by a photolithography/etching process or some other suitable patterning process. In some embodiments, the photolithography/etching process comprises: 1) forming a photoresist mask 1202 with a layout of the bond pad 116 on the bond pad layer 1102; 2) applying an etchant 1204 to the bond pad layer 1102 with the photoresist mask 1202 in place; and 3) stripping the photoresist mask 1202.

Figure 13:
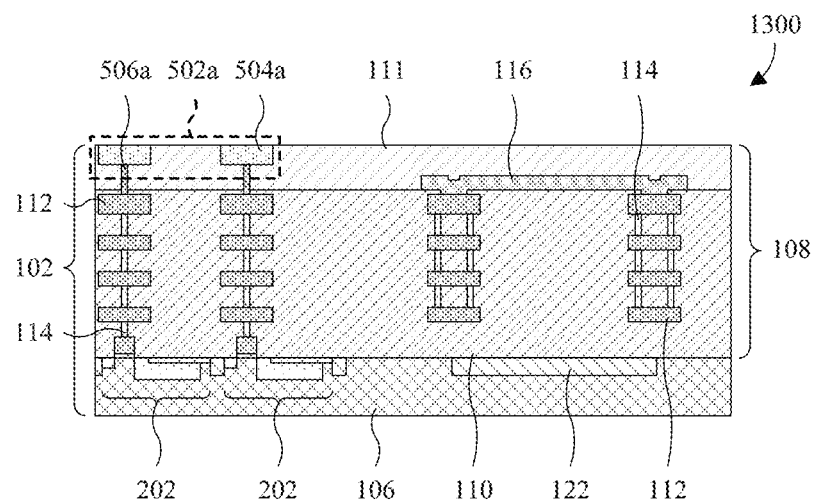

As illustrated by the cross-sectional view 1300 of FIG. 13, the first interconnect structure 108 is completed around the bond pad 116, thereby defining a first integrated chip 102. In completing the first interconnect structure 108, a first passivation layer 111 and a first hybrid bond structure 502a are formed over the bond pad 116 and the first interconnect dielectric structure 110. In alternative embodiments, first hybrid bond structure 502a is omitted. The first hybrid bond structure 502a comprises first hybrid bond pads 504a and first hybrid bond vias 506a. For ease of illustration, only one of the first hybrid bond pads 504a is labeled 504a and only one of the first hybrid bond vias 506a is labeled 506a. The first hybrid bond pads 504a and the first hybrid bond vias 506a are stacked in the first passivation layer 111, and the first hybrid bond vias 506a electrically couple the first hybrid bond pads 504a to a topmost level of the first wires 112. For ease of illustration, only some of the first wires 112 are labeled 112.

In some embodiments, a process for completing the first interconnect structure 108 comprises: 1) depositing the first passivation layer 111; 2) patterning the first passivation layer 111 with openings for the first hybrid bond pads 504a and the first hybrid bond vias 506a; 3) and filling the openings with conductive material to form the first hybrid bond pads 504a and the first hybrid bond vias 506a. In other embodiments, a process for completing the first interconnect structure 108 comprises: 1) depositing a first portion of the first passivation layer 111; 2) patterning the first portion with via openings for the first hybrid bond vias 506a; 3) filling the via openings with conductive material to form the first hybrid bond vias 506a; 4) depositing a second portion of the first passivation layer 111; 5) patterning the second portion with pad openings for the first hybrid bond pads 504a; and 6) filling the pad openings with conductive material to form the first hybrid bond pads 504a.

Figure 14:
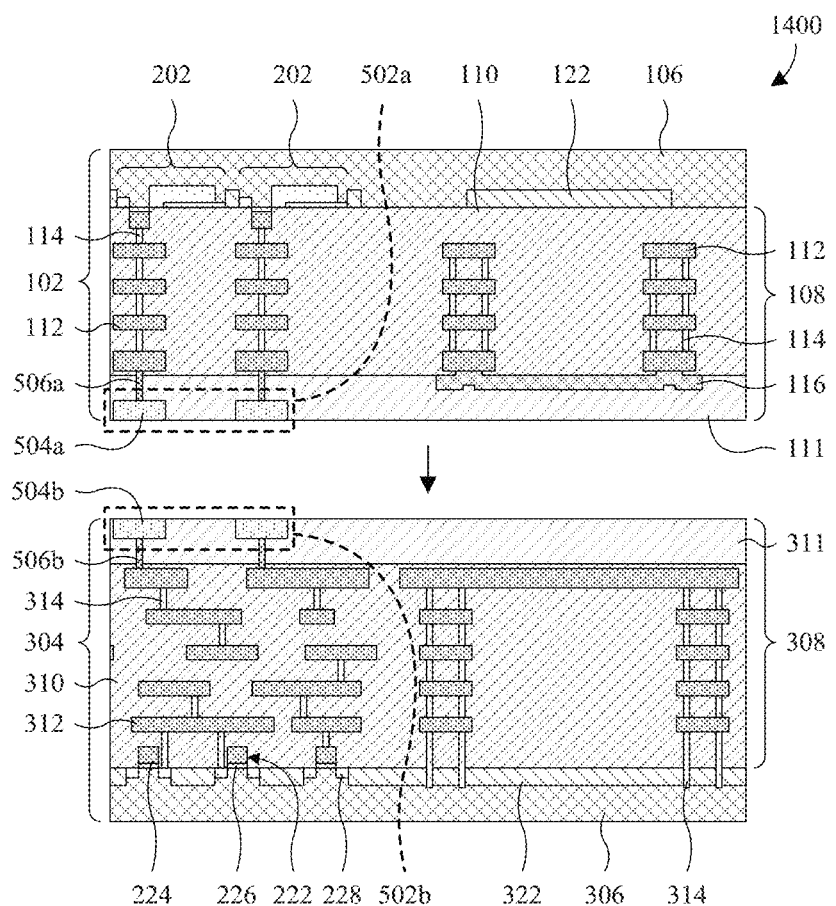

As illustrated by the cross-sectional view 1400 of FIG. 14, a second integrated chip 304 is provided or otherwise formed. The second integrated chip 304 may, for example, be as described with regard to FIG. 3 and/or FIG. 5. The second integrated chip 304 comprises a second chip substrate 306, a plurality of logic devices 222, and a second interconnect structure 308. For ease of illustration, only one of the logic devices 222 is labeled 222.

The logic devices 222 overlie the second chip substrate 306 and, in some embodiments, are separated from each other by a second isolation structure 322. The second interconnect structure 308 overlies the second chip substrate 306 and the logic devices 222. Further, the second interconnect structure 308 comprises a second interconnect dielectric structure 310, a second passivation layer 311, a plurality of second wires 312, a plurality of second vias 314, and a second hybrid bond structure 502b. For ease of illustration, only some of the second wires 312 are labeled 312 and only some of the second vias 314 are labeled 314. In alternative embodiments, the second hybrid bond structure 502b is omitted. The second wires 312 and the second vias 314 are stacked in the second interconnect dielectric structure 310, and the second hybrid bond structure 502b is in the second passivation layer 311. The second hybrid bond structure 502b comprises second hybrid bond pads 504b and second hybrid bond vias 506b. For ease of illustration, only one of the second hybrid bond pads 504b is labeled 504b and only one of the second hybrid bond vias 506b is labeled 506b.

Also illustrated by the cross-sectional view 1400 of FIG. 14, the first and second integrated chips 102, 304 are bonded together at the first and second interconnect structures 108, 308. The bonding may, for example, be performed by direct bonding, hybrid bonding, or some other suitable bonding process. In alternative embodiments, the first integrated chip 102 is bonded to a support substrate 126 (see, e.g., FIG. 2) instead of the second integrated chip 304.

Figure 15:
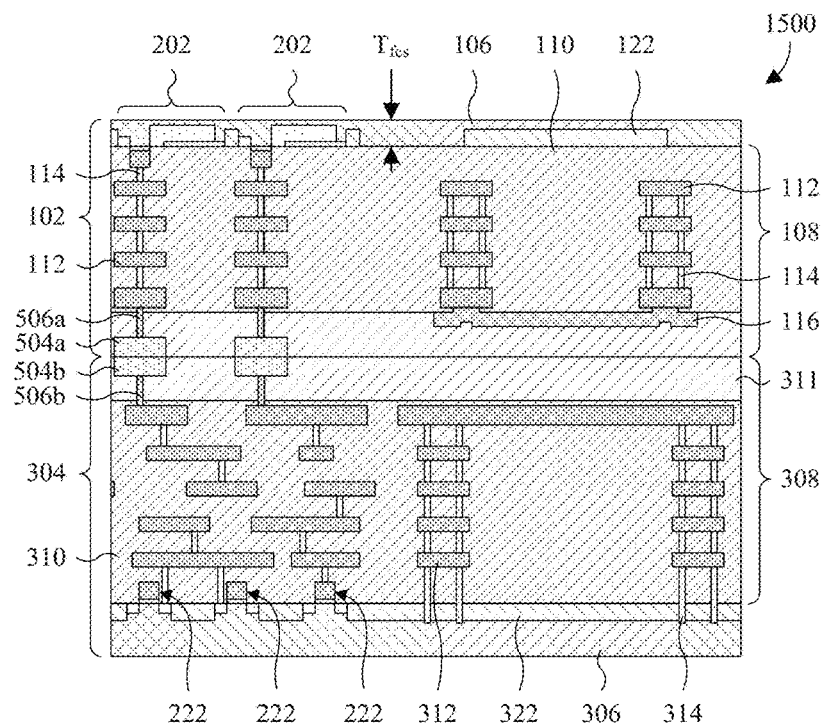

As illustrated by the cross-sectional view 1500 of FIG. 15, the first chip substrate 106 is thinned to reduce a thickness $T_{fcs}$ of the first chip substrate 106. The thinning may, for example, be performed by a chemical mechanical planarization (CMP) or some other suitable thinning process.

Figure 16:
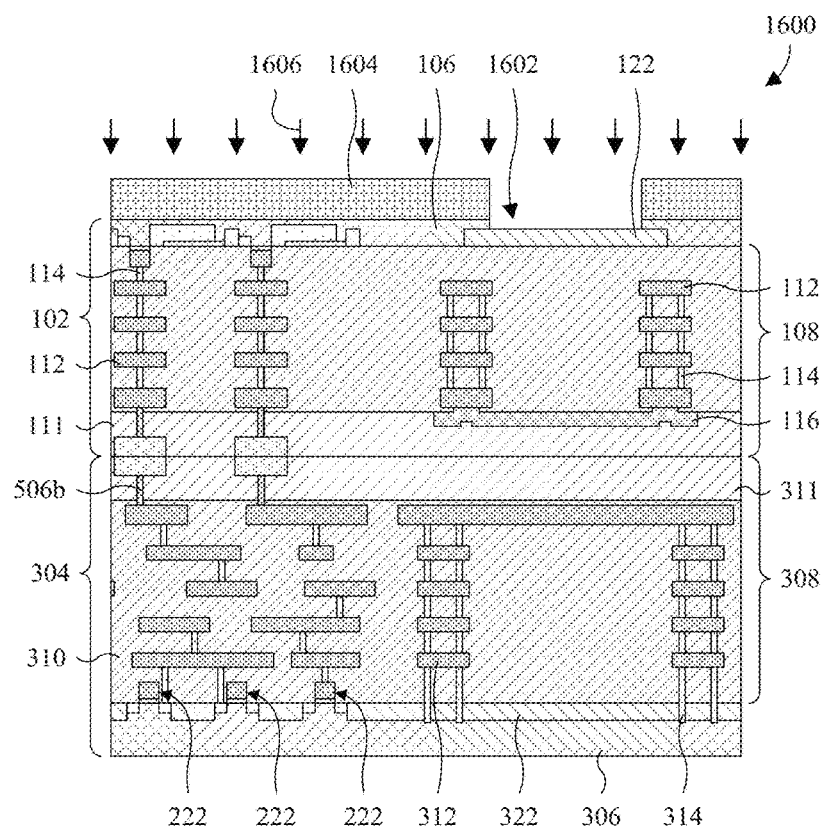

As illustrated by the cross-sectional view 1600 of FIG. 16, the first chip substrate 106 is patterned to form a first pad opening 1602 overlying the bond pad 116 and exposing the first isolation structure 122. The patterning may, for example, be performed by a photolithography/etching process or some other suitable patterning process. In some embodiments, the photolithography/etching process comprises: 1) forming a photoresist mask 1604 with a layout of the first pad opening 1602 on the first chip substrate 106; 2) applying an etchant 1606 to the first chip substrate 106 with the photoresist mask 1604 in place; and 3) stripping the photoresist mask 1604.

Figure 17:
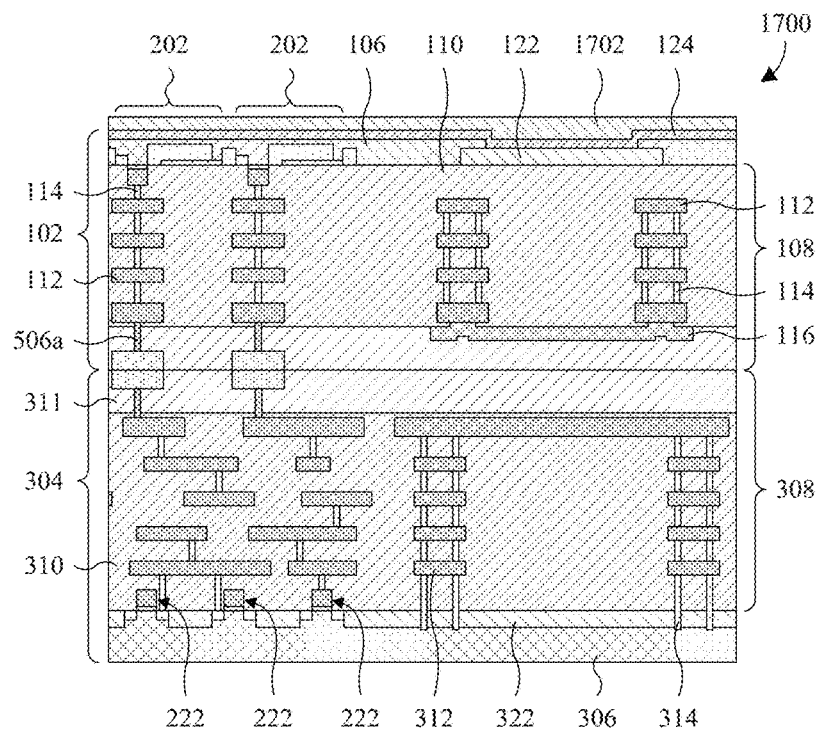

As illustrated by the cross-sectional view 1700 of FIG. 17, a buffer layer 124 and a hard mask layer 1702 are formed on the first chip substrate 106. The buffer layer 124 is formed covering the first chip substrate 106 and lining the first pad opening 1602 (see FIG. 16), whereas the hard mask layer 1702 is formed covering the buffer layer 124 and filling the first pad opening 1602 over the buffer layer 124. Further, the hard mask layer 1702 is formed with a top surface that is flat or planarized. The buffer layer 124 may, for example, be formed by CVD, PVD, or some suitable deposition process. The hard mask layer 1702 may, for example, be formed by depositing the hard mask layer 1702 and subsequently performing a planarization into the hard mask layer 1702 to flatten or otherwise planarize the top surface of the hard mask layer 1702. The depositing of the hard mask layer 1702 may, for example, be performed by CVD, PVD, or some suitable deposition process. The planarization may, for example, be performed by a CMP or some other suitable planarization process.

Figure 18:
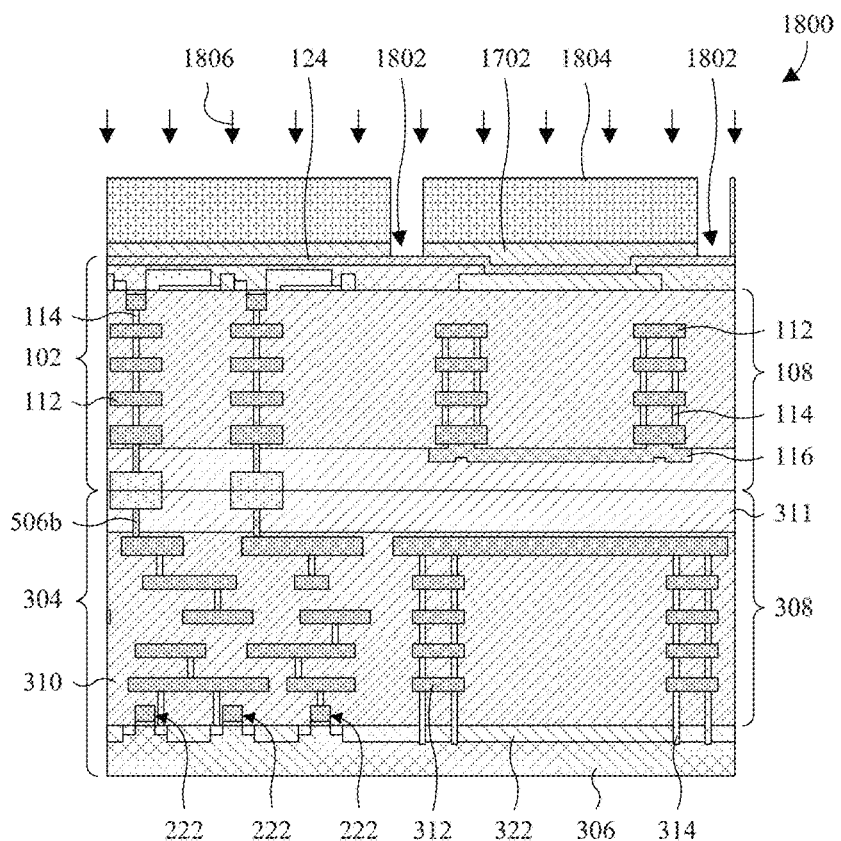

As illustrated by the cross-sectional view 1800 of FIG. 18, the hard mask layer 1702 is patterned to define TSV-pad openings 1802 respectively on opposite sides of the bond pad 116. The patterning may, for example, be performed by a photolithography/etching process or some other suitable patterning process. In some embodiments, the photolithography/etching process comprises: 1) forming a photoresist mask 1804 with a layout of the TSV-pad openings 1802 on the hard mask layer 1702; 2) applying an etchant 1806 to the hard mask layer 1702 with the photoresist mask 1804 in place; and 3) stripping the photoresist mask 1804.

Figure 19:
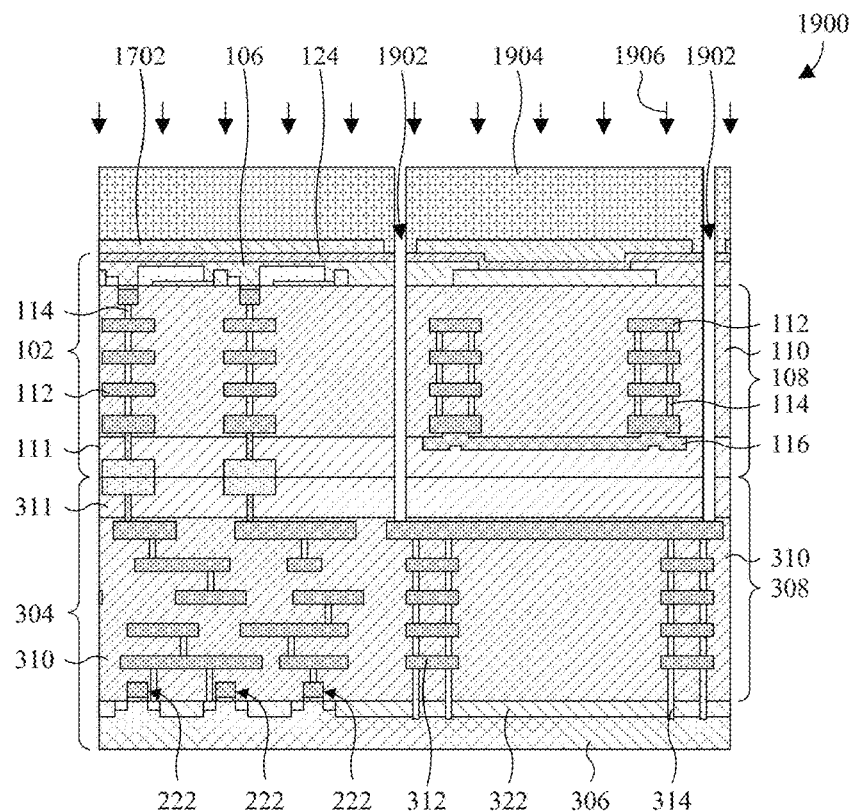

As illustrated by the cross-sectional view 1900 of FIG. 19, the first and second integrated chips 102, 304 are patterned to form a pair of TSV openings 1902 extending through the first chip substrate 106, the first interconnect dielectric structure 110, the first passivation layer 111, and the second passivation layer 311 to a topmost level of the second wires 312. The patterning may, for example, be performed by a photolithography/etching process or some other suitable patterning process. In some embodiments, the photolithography/etching process comprises: 1) forming a photoresist mask 1904 with a layout of the TSV openings 1902 on the hard mask layer 1702; 2) applying one or more etchants 1906 to the first and second integrated chips 102, 304 with the photoresist mask 1904 in place; and 3) stripping the photoresist mask 1904.

Figure 20:
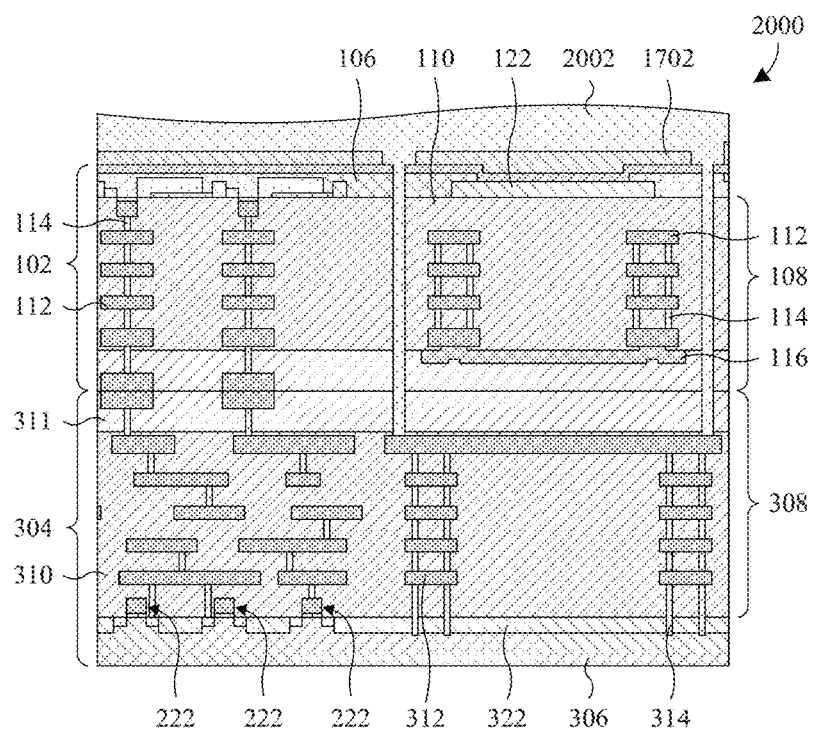

As illustrated by the cross-sectional view 2000 of FIG. 20, a TSV layer 2002 is formed covering the hard mask layer 1702 and filling the TSV openings 1902 (see FIG. 19) and the TSV-pad openings 1802 (see FIG. 18). The TSV layer 2002 may, for example, be formed by CVD, PVD, electroless plating, electroplating, some other suitable deposition process(es), or any combination of the foregoing.

Figure 21:
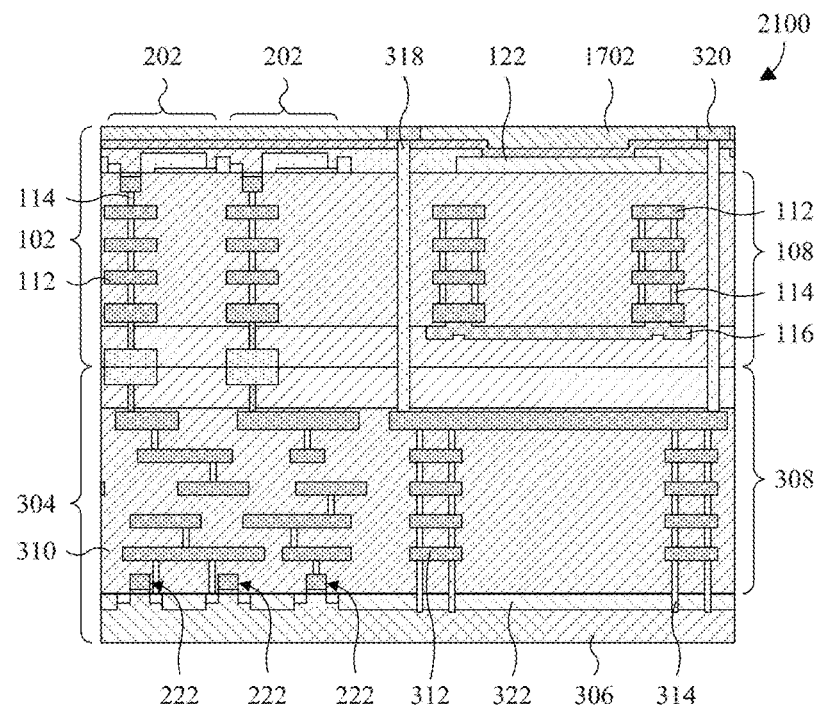

As illustrated by the cross-sectional view 2100 of FIG. 21, a planarization is performed into the TSV layer 2002 (see FIG. 20) to form TSVs 318 and TSV pads 320 respectively in the TSV openings 1902 (see FIG. 19) and the TSV-pad openings 1802 (see FIG. 18). For ease of illustration, only one of the TSV pads 320 is labeled 320 and only one of the TSVs 318 is labeled 318. Further, note that hashing between the TSVs 318 and the TSV pads 320 is different to better illustrate the TSV pads 320 and the TSVs 318 notwithstanding that the TSV pads 320 and the TSVs 318 are both formed from the TSV layer 2002. The planarization may, for example, be performed by a CMP or some other suitable planarization process.

Figure 22:
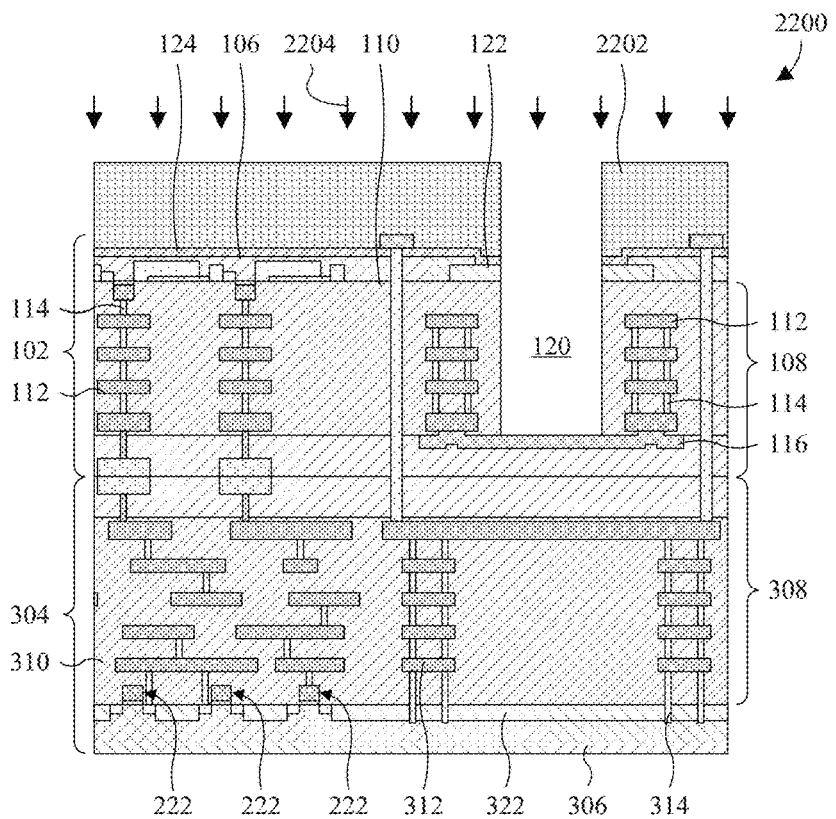

As illustrated by the cross-sectional view 2200 of FIG. 22, the hard mask layer 1702 (see FIG. 21) is removed. The removal may, for example, be performed by an etching process or some other suitable removal process.

Also illustrated by the cross-sectional view 2200 of FIG. 22, the buffer layer 124, the first isolation structure 122, and the first interconnect dielectric structure 110 are patterned to define a second pad opening 120 overlying and exposing the bond pad 116. The patterning may, for example, be performed by a photolithography/etching process or some other suitable patterning process. In some embodiments, the photolithography/etching process comprises: 1) forming a photoresist mask 2202 with a layout of the second pad openings 120 on the buffer layer 124; 2) applying one or more etchants 2204 to the first integrated chip 102 with the photoresist mask 2202 in place; and 3) stripping the photoresist mask 2202.

Figure 23:
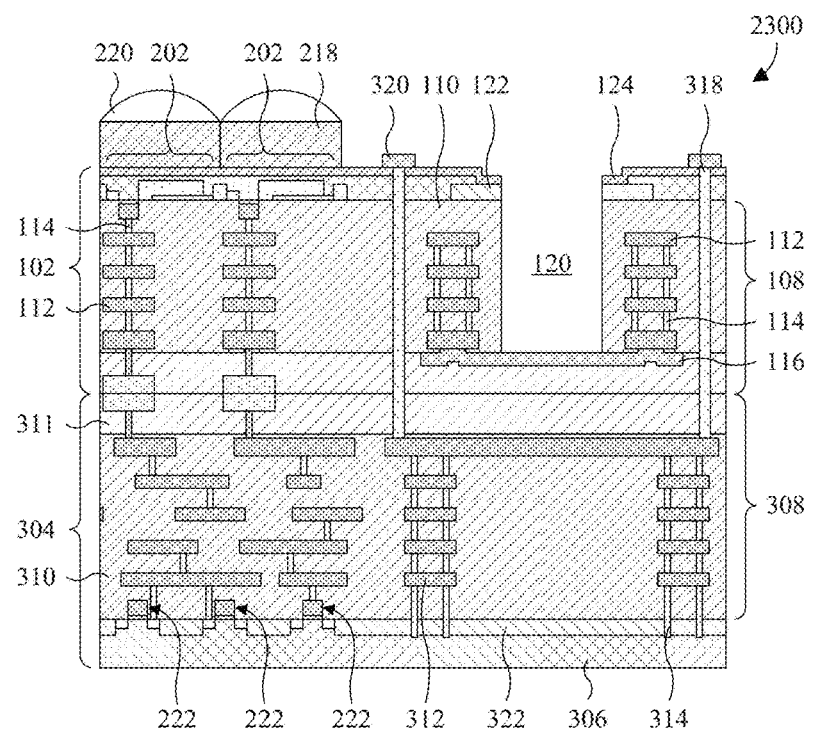

As illustrated by the cross-sectional view 2300 of FIG. 23, color filters 218 and micro lenses 220 are formed stacked over the pixel sensors 202. For ease of illustration, only one of the color filters 218 is labeled 218 and only one of the micro lenses 220 is labeled 220.

Figure 24A:
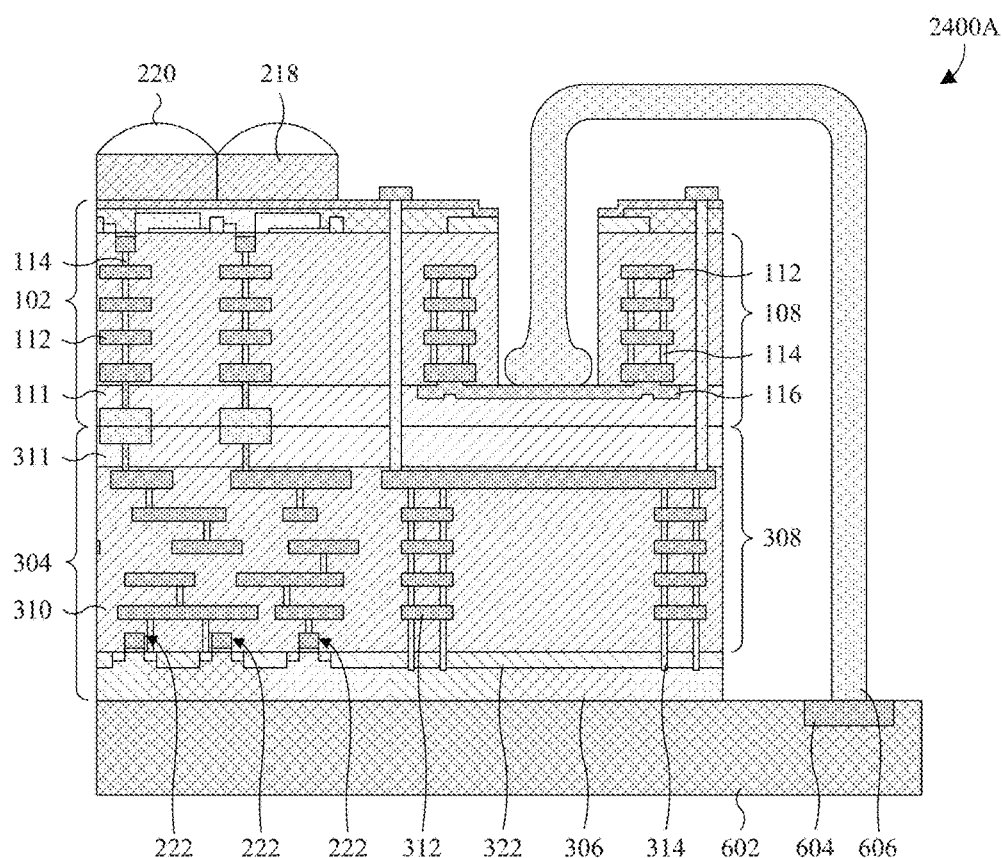

As illustrated by the cross-sectional view 2400A of FIG. 24A, a package substrate 602 comprising a package pad 604 is provided. Further, the package substrate 602 is bonded to the second chip substrate 306 and wire bonding is performed to form a bond wire 606 from the bond pad 116 to the package pad 604. In alternative embodiments, as illustrated by the cross-sectional view 2400B of FIG. 24B, flip chip bonding is performed in place of wire bonding. As a result, a pair of conductive bumps 608 are stacked from the bond pad 116 to the package pad 604.

Figure 24B:
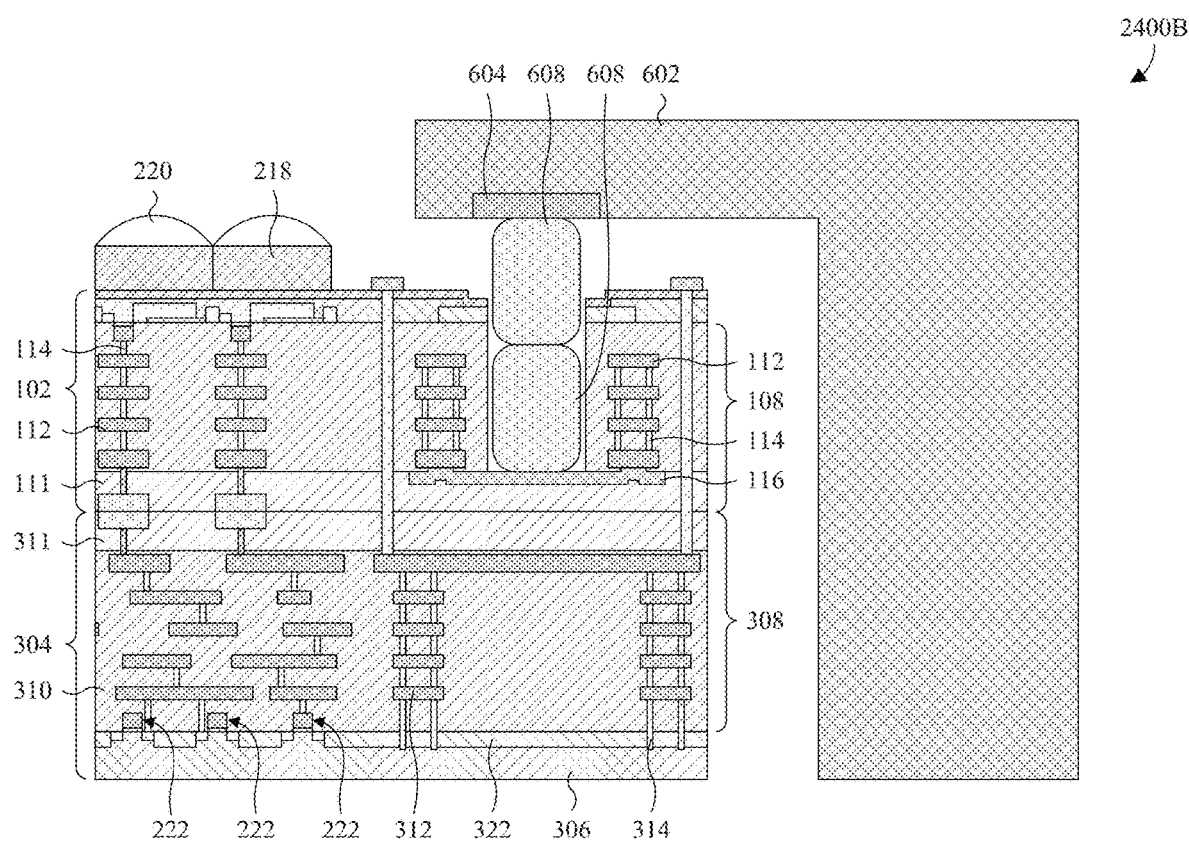

The bonding at FIGS. 24A and 24B may impose high stress on the bond pad 116. Because the bond pad 116 is inset into the first passivation layer 111, the first passivation layer 111 absorbs stress imposed on the bond pad 116. This, in turn, reduces the likelihood of peeling and/or cracking defects at the bond pad 116. Further, because the bond pad contacts the first wires 112 at the top wire level, cracking at this interface is less likely. The top wire level is thicker than other wire levels and is hence more tolerant of stress and less likely to crack.

Notwithstanding that the method is illustrated using the integrated chip packages of FIGS. 7A and 7B, the method may be used (with or without modification) to form the integrated chip package in any one of FIGS. 6A and 6B, the 3DIC 302 in any one of FIGS. 3, 4, and 5, and the integrated chip 102 in any one of FIGS. 1A and 2. Further, while the cross-sectional views 800-2300, 2400A, and 2400B shown in FIGS. 8-23, 24A, and 24B are described with reference to the method, it will be appreciated that the structures shown in FIGS. 8-23, 24A, and 24B are not limited to the method and may stand alone without the method.

Figure 25:
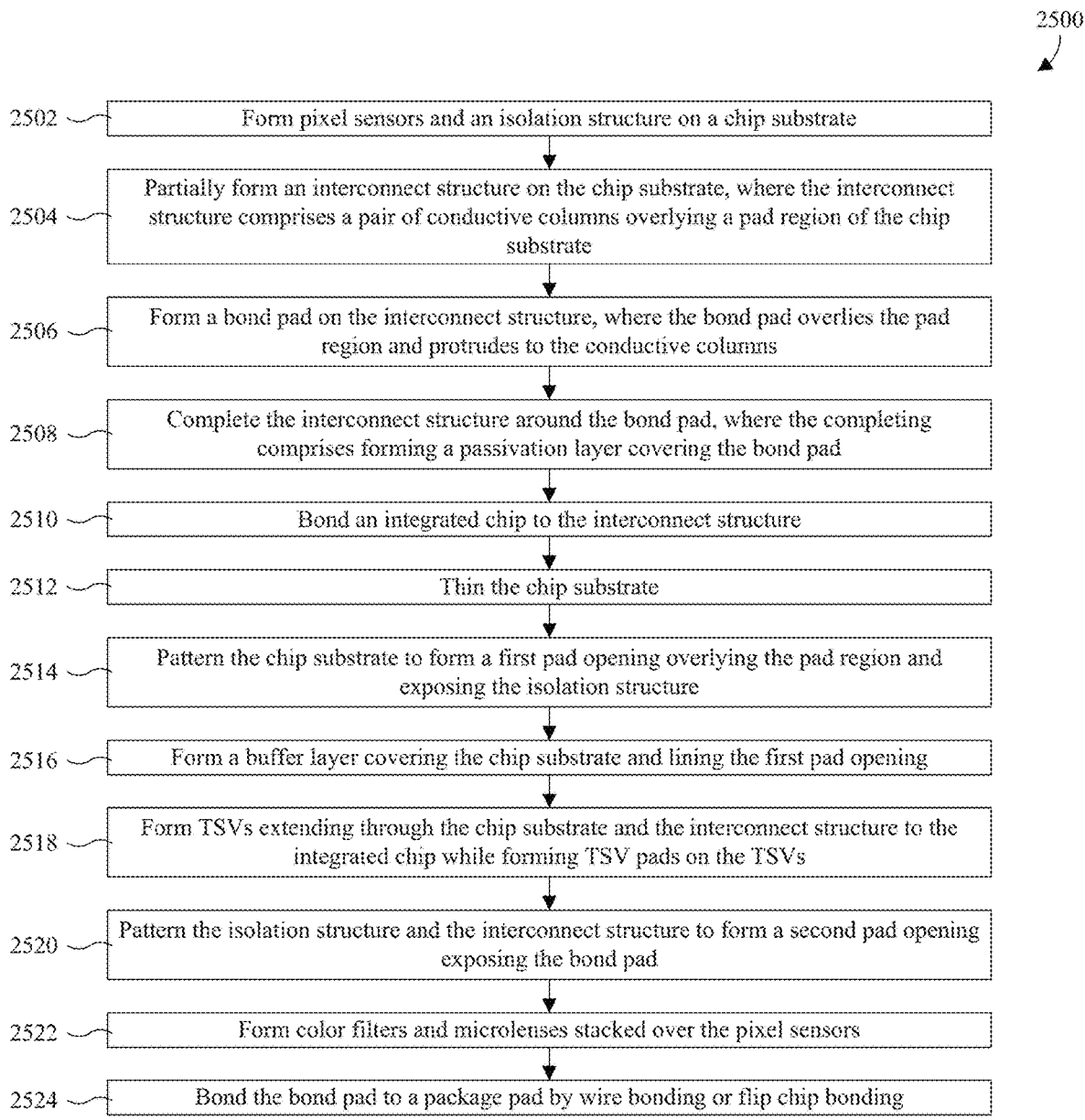
FIG. 25 illustrates a block diagram of some embodiments of the method of FIGS. 8-23, 24A, and 24B.

With reference to FIG. 25, a block diagram 2500 of some embodiments of the method of FIGS. 8-23, 24A, and 24B is provided.

At 2502, pixel sensors and an isolation structure are formed on a chip substrate. See, for example, FIG. 8.

At 2504, an interconnect structure is partially formed on the chip substrate, where the interconnect structure comprises a pair of conductive columns overlying a pad region of the chip substrate. See, for example, FIG. 9.

At 2506, a bond pad is formed on the interconnect structure, where the bond pad overlies the pad region and protrudes to the conductive columns. See, for example, FIGS. 10-12.

At 2508, the interconnect structure is completed around the bond pad, where the completing comprises forming a passivation layer covering the bond pad. See, for example, FIG. 13.

At 2510, an integrated chip is bonded to the interconnect structure. See, for example, FIG. 14. In alternative embodiments, a support substrate (see, e.g., 126 in FIGS. 1A and 2) is used in place of the integrated chip.

At 2512, the chip substrate is thinned. See, for example, FIG. 15.

At 2514, the chip substrate is patterned to form a first pad opening overlying the pad region and exposing the isolation structure. See, for example, FIG. 16.

At 2516, a buffer layer is formed covering the chip substrate and lining the first pad opening. See, for example, FIG. 17.

At 2518, TSVs are formed extending through the chip substrate and the interconnect structure to the integrated chip while forming TSV pads on the TSVs. See, for example, FIGS. 18-21.

At 2520, the isolation structure and the interconnect structure are patterned to form a second pad opening exposing the bond pad. See, for example, FIG. 22.

At 2522, color filters and microlenses are formed stacked over the pixel sensors. See, for example, FIG. 23.

At 2524, the bond pad is bonded to a package pad by wire bonding or flip chip bonding. See, for example, FIGS. 24A and 24B.

While the block diagram 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: a substrate; an interconnect structure adjoining the substrate, wherein the interconnect structure includes a plurality of wires and a plurality of vias, and wherein the wires and the vias are alternatingly stacked; and a pad in the interconnect structure, wherein the wires and the vias are between the pad and the substrate, and wherein the interconnect structure partially defines a pad opening extending through the substrate and exposing the pad. In some embodiments, the integrated chip further includes a bond wire in the pad opening and contacting the pad. In some embodiments, the integrated chip further includes a conductive bump in the pad opening and contacting the pad. In some embodiments, the wires and the vias define a first conductive column and a second conductive column when view in cross section, wherein the first and second conductive columns are respectively on opposite sides of the pad opening and adjoin the pad. In some embodiments, the wires are grouped into multiple wire levels, including a first wire level and a second wire level, wherein the pad protrudes to contact with the first and second conductive columns at the first wire level, and wherein the first wire level has a greater thickness than the second wire level. In some embodiments, the integrated chip further includes an isolation structure extending into the substrate, between the substrate and the interconnect structure, wherein the isolation structure includes a dielectric material and partially defines the pad opening. In some embodiments, the integrated chip further includes pixel sensors on the substrate, between the substrate and the interconnect structure, wherein the pixel sensors include photodetectors in the substrate, and wherein the wires and the vias define conductive paths extending from the pixel sensors. In some embodiments, the integrated chip further includes: a second substrate; a second interconnect structure adjoining the second substrate, between the interconnect structure and the second substrate, wherein the second interconnect structure includes a plurality of second wires and a plurality of second vias, and wherein the second wires and the second vias are alternatingly stacked; and a first TSV extending through the substrate and the interconnect structure to one of the second wires. In some embodiments, the integrated chip further includes a second TSV extending through the substrate and the interconnect structure to the one of the second wires, wherein the first and second TSVs are respectively on opposite sides of the pad opening. In some embodiments, the second wires and the second vias define a first conductive column and a second conductive column when views in cross-section, wherein the first and second conductive columns extend from the one of the second wires to the second substrate and are respectively on opposite sides of the pad opening.

In some embodiments, the present application provides an integrated chip package including: an integrated chip including an interconnect structure and a chip pad, wherein the chip pad is in the interconnect structure, wherein the interconnect structure includes multiple wires and multiple vias, wherein the wires and the vias are alternatingly stacked and define a first conductive structure adjoining the chip pad, and wherein the interconnect structure defines an opening extending through the conductive structure and exposing the chip pad; a package substrate; a package pad in the package substrate; and a second conductive structure extending from the chip pad to the package pad, and further electrically coupling the chip pad and the package pad. In some embodiments, the second conductive structure includes a bond wire. In some embodiments, the second conductive structure includes a pair of conductive bumps, wherein the conductive bumps are stacked upon each other in the opening. In some embodiments, the package substrate wraps around a top corner of the integrated chip and includes an overhang portion, wherein the overhang portion accommodates the package pad and overhangs the chip pad and the second conductive structure. In some embodiments, the integrated chip further includes: a chip substrate; and a STI structure extending into the chip substrate, between the chip substrate and the interconnect structure, wherein the STI structure partially defines the opening.

In some embodiments, the present application provides another integrated chip including: a substrate; an interconnect structure adjoining the substrate, wherein the interconnect structure includes a plurality of wires and a plurality of vias, and wherein the wires and the vias are alternatingly stacked; a pad in the interconnect structure, wherein the wires and the vias are between the pad and the substrate; and a conductive structure extending through the substrate to the pad. In some embodiments, the conductive structure includes a bond wire contacting the pad. In some embodiments, the conductive structure includes a conductive bump contacting the pad. In some embodiments, the wires and the vias define a first conductive column and a second conductive column when viewed in cross section, wherein the first and second conductive columns adjoin the pad, and wherein conductive structure is between the first and second conductive columns. In some embodiments, the wires are grouped into multiple wire levels, including a first wire level and a second wire level, wherein the pad protrudes to contact with the first and second conductive columns at the first wire level, and wherein the first wire level has a greater thickness than the second wire level. In some embodiments, the interconnect structure further includes an interconnect dielectric layer having an interconnect-dielectric sidewall, wherein the integrated chip further includes: an isolation structure extending into the substrate, between the substrate and the interconnect structure, wherein the isolation structure includes a dielectric material and has an isolation-structure sidewall, and wherein the isolation-structure sidewall is aligned with the interconnect-dielectric sidewall and faces the conductive structure. In some embodiments, the integrated chip further includes pixel sensors on the substrate, between the substrate and the interconnect structure, wherein the pixel sensors include photodetectors in the substrate, and wherein the wires and the vias define conductive paths extending from the pixel sensors. In some embodiments, the integrated chip further includes: a second substrate; a second interconnect structure adjoining the second substrate, between the interconnect structure and the second substrate, wherein the second interconnect structure includes a plurality of second wires and a plurality of second vias, and wherein the second wires and the second vias are alternatingly stacked; and a first TSV extending through the substrate and the interconnect structure to one of the second wires. In some embodiments, the integrated chip further includes a second TSV extending through the substrate and the interconnect structure to the one of the second wires, wherein the conductive structure is between the first and second TSVs. In some embodiments, the second wires and the second vias define a first conductive column and a second conductive column when viewed in cross-section, wherein the first and second conductive columns extend from the one of the second wires to the second substrate, and wherein the conductive structure is laterally between the first and second conductive columns.

In some embodiments, the present application provides another integrated chip including: a passivation layer; a pad overlying and recessed into the passivation layer; a conductive column overlying and contacting the pad, wherein the conductive column extends laterally along a periphery of the pad in a first closed path, and wherein conductive column includes an alternatingly stack of wires and vias; a semiconductor substrate overlying the conductive column; and a conductive structure extending through the semiconductor substrate and the conductive column to the pad. In some embodiments, the pad has an upward protrusion protruding to the conductive column, wherein the upward protrusion extends laterally along the periphery of the pad in a second closed path. In some embodiments, a top layout of the conductive column is ring shaped. In some embodiments, the alternating stack of wires and vias includes a first level wire and a second level wire, wherein the first level wire contacts the pad and has a first thickness, and wherein the second level wire overlies the first level wire and has a second thickness less than the first thickness. In some embodiments, the first and second level wires each extend laterally along the periphery of the pad to completely surround the conductive structure.

In some embodiments, the present application provides a method including: forming an interconnect structure on a first side of a substrate, wherein the interconnect structure includes a plurality of wires and a plurality of vias, and wherein the wires and the vias are alternatingly stacked from the substrate to a top level of wires; forming a pad on the interconnect structure, wherein the pad protrudes to contact with the top level of wires; and performing an etch into the interconnect structure from a second side of the substrate to form an opening extending through the substrate and the interconnect structure to the pad. In some embodiments, the method further includes forming a passivation layer covering and contacting the pad and the interconnect structure. In some embodiments, the interconnect structure and the substrate at least partially define a first integrated chip, wherein the method further includes: forming a second integrated chip including a second interconnect structure and a second substrate; and bonding the first and second integrated chips together, such that the interconnect structure and the second interconnect structure are between the substrate and the second substrate. In some embodiments, the second interconnect structure includes a wire, wherein the method further includes: performing a second etch into the substrate, the interconnect structure, and the second interconnect structure to form two via openings exposing the wire, wherein the pad is between the via openings; and filling the via openings with conductive material to define TSVs. In some embodiments, the method further includes forming pixel sensors on the substrate, wherein the interconnect structure is formed after the forming of the pixel sensors and covers the pixel sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   an interconnect structure adjoining the substrate, wherein the interconnect structure comprises a plurality of wires and a plurality of vias, and wherein the wires and the vias are alternatingly stacked;
   a pad in the interconnect structure, wherein the wires and the vias are between the pad and the substrate; and
   a conductive structure extending through the substrate to the pad;
   wherein the wires and the vias define a first conductive column and a second conductive column respectively on opposite sides of the pad when viewed in cross section, wherein a top of the pad has a pair of protrusions respectively on the opposite sides when viewed in cross section, wherein the protrusions protrude upward respectively to the first and second conductive columns, and wherein a bottom of the pad has a pair of recesses respectively underlying the protrusions when viewed in cross section.

2. The integrated chip according to claim 1, wherein the conductive structure comprises a bond wire contacting the pad.

3. The integrated chip according to claim 1, wherein the conductive structure comprises a conductive bump contacting the pad.

4. The integrated chip according to claim 1, wherein the first and second conductive columns adjoin the pad, and wherein the conductive structure is between the first and second conductive columns.

5. The integrated chip according to claim 4, wherein the wires are grouped into multiple wire levels, including a first wire level and a second wire level, wherein the pad protrudes to contact with the first and second conductive columns at the first wire level, and wherein the first wire level has a greater thickness than the second wire level.

6. The integrated chip according to claim 1, wherein the interconnect structure further comprises an interconnect dielectric layer having an interconnect-dielectric sidewall, and wherein the integrated chip further comprises:
   an isolation structure extending into the substrate, between the substrate and the interconnect structure, wherein the isolation structure comprises a dielectric material and has an isolation-structure sidewall, and wherein the isolation-structure sidewall is aligned with the interconnect-dielectric sidewall and faces the conductive structure.

7. The integrated chip according to claim 1, further comprising:
pixel sensors on the substrate, between the substrate and the interconnect structure, wherein the pixel sensors comprise photodetectors in the substrate, and wherein the wires and the vias define conductive paths extending from the pixel sensors.

8. The integrated chip according to claim 1, further comprising:
a second substrate;
a second interconnect structure adjoining the second substrate, between the interconnect structure and the second substrate, wherein the second interconnect structure comprises a plurality of second wires and a plurality of second vias, and wherein the second wires and the second vias are alternatingly stacked; and
a first through substrate via (TSV) extending through the substrate and the interconnect structure to one of the second wires.

9. The integrated chip according to claim 8, further comprising:
a second TSV extending through the substrate and the interconnect structure to the one of the second wires, wherein the conductive structure is between the first and second TSVs.

10. The integrated chip according to claim 1, further comprising:
a second substrate underlying the interconnect structure;
a second interconnect structure between the second substrate and the interconnect structure, wherein the second interconnect structure comprises a plurality of second wires and a plurality of second vias alternatingly stacked to define a third conductive column and a fourth conductive column respectively on the opposite sides of the pad and covered by a common wire of the second interconnect structure; and
a pair of through substrate vias (TSVs) respectively overlying the third and fourth conductive columns and extending through the substrate to the common wire.

11. An integrated chip comprising:
a passivation layer;
a pad overlying and recessed into the passivation layer;
a conductive column overlying and contacting the pad, wherein the conductive column extends laterally along a periphery of the pad in a first closed path, and wherein the conductive column comprises an alternating stack of wires and vias;
a semiconductor substrate overlying the conductive column; and
a conductive structure extending through the semiconductor substrate and the conductive column to the pad;
wherein the alternating stack of wires and vias comprises a first level wire and a second level wire, wherein the first level wire contacts the pad and has a first thickness, and wherein the second level wire overlies the first level wire and has a second thickness less than the first thickness.

12. The integrated chip according to claim 11, wherein the pad has an upward protrusion protruding to the conductive column, and wherein the upward protrusion extends laterally along the periphery of the pad in a second closed path.

13. The integrated chip according to claim 11, wherein a top layout of the conductive column is ring shaped.

14. The integrated chip according to claim 11, wherein the first and second level wires each extend laterally along the periphery of the pad to completely surround the conductive structure.

15. A method comprising:
forming an interconnect structure on a first side of a substrate, wherein the interconnect structure comprises a plurality of wires and a plurality of vias, and wherein the wires and the vias are alternatingly stacked from the substrate to a top level of wires;
forming a pad on the interconnect structure, wherein the pad protrudes to contact with the top level of wires;
forming an integrated chip comprising a second substrate and a second interconnect structure on the second substrate, wherein the second interconnect structure comprises a plurality of second wires and a plurality of second vias alternatingly stacked to define a pair of conductive columns covered by a common wire;
bonding the integrated chip to the interconnect structure, such that the conductive columns are respectively on opposite sides of the pad;
forming a pair of through substrate vias (TSVs) respectively overlying the conductive columns and extending through the substrate to the common wire; and
performing an etch into the interconnect structure from a second side of the substrate to form an opening extending through the substrate and the interconnect structure to the pad.

16. The method according to claim 15, further comprising:
forming a passivation layer covering and contacting the pad and the interconnect structure.

17. The method according to claim 15, wherein the bonding is such that the interconnect structure and the second interconnect structure are between the substrate and the second substrate.

18. The method according to claim 15, further comprising:
forming pixel sensors on the substrate, wherein the interconnect structure is formed after the forming of the pixel sensors and covers the pixel sensors.

19. The method according to claim 15, wherein the conductive columns have the same cross-sectional profile and extend from the common wire to the second substrate.

20. The method according to claim 15, wherein the wires are grouped into multiple levels, including a bottom level of wires and the top level of wires, wherein a top wire in the top level directly contacts the pad and has a first thickness, and wherein a bottom wire in the bottom level has a second thickness less than the first thickness.

* * * * *